United States Patent
Tajiri et al.

[11] Patent Number: 6,072,607
[45] Date of Patent: *Jun. 6, 2000

[54] OPTICAL PICKUP DEVICE

[75] Inventors: Atsushi Tajiri; Kazushi Mori; Keiichi Yodoshi; Takao Yamaguchi, all of Osaka-fu, Japan

[73] Assignee: Sanyo Electric Co., Ltd., Moriguchi, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/866,444

[22] Filed: May 30, 1997

Related U.S. Application Data

[63] Continuation of application No. 08/259,673, Jun. 13, 1994, abandoned.

[30] Foreign Application Priority Data

Oct. 15, 1993 [JP] Japan .................................... 5-258436
Dec. 28, 1993 [JP] Japan .................................... 5-335717

[51] Int. Cl.[7] .............................. G02B 5/32; G02B 5/12; G11B 7/00
[52] U.S. Cl. .............................. 359/15; 359/19; 359/566; 369/103; 369/109; 369/44.14; 369/44.23
[58] Field of Search ................................ 359/13, 15, 571, 359/19, 566; 369/44.14, 44.23, 112, 103, 109

[56] References Cited

U.S. PATENT DOCUMENTS

| | | |
|---|---|---|
| 4,731,772 | 3/1988 | Lee . |
| 4,885,734 | 12/1989 | Yuzo ..................................... 369/44.23 |
| 4,929,823 | 5/1990 | Kato et al. ........................... 369/44.37 |
| 4,972,400 | 11/1990 | Kunabara et al. ................... 369/44.29 |
| 5,016,954 | 5/1991 | Onayama et al. ........................ 359/15 |
| 5,018,804 | 5/1991 | Jung et al. ................................ 359/15 |
| 5,070,488 | 12/1991 | Fukushima et al. .................... 359/571 |
| 5,243,583 | 9/1993 | Ohuchida et al. ................... 369/44.12 |
| 5,285,062 | 2/1994 | Lee . |
| 5,293,038 | 3/1994 | Kadowaki et al. .................. 369/44.23 |
| 5,446,719 | 8/1995 | Yoshida .................................. 369/116 |
| 5,481,524 | 1/1996 | Ueno et al. .......................... 369/44.23 |

FOREIGN PATENT DOCUMENTS

| | | | |
|---|---|---|---|
| 4-60931 | 2/1992 | Japan | G11B 7/135 |
| 5-307760 | 11/1993 | Japan | G11B 7/09 |
| 6-203403 | 7/1994 | Japan | G11B 7/125 |

*Primary Examiner*—Audrey Chang
*Attorney, Agent, or Firm*—Darby & Darby

[57] ABSTRACT

An optical pickup device of the present invention includes a substrate having at least a major surface, a semiconductor laser provided on the surface of the substrate for emitting laser beam, a reflection-type diffraction grating oriented to the semiconductor laser for splitting the laser beam into at least three beams and reflecting them upward, a hologram for receiving the three beams reflected from the reflection-type diffraction grating, and an objective lens for converging onto an optical recording medium the three beams transmitted by the hologram. The three beams reflected from the optical recording medium are focused by the hologram and directed onto the photodetector from the above.

16 Claims, 19 Drawing Sheets

OPTICAL PICKUP DEVICE

This is a continuation of application Ser. No. 08/259,673, filed Jun. 13, 1994 now abandoned.

BACKGROUND OF THE INVENTION

1. Field of the Invention

The present invention relates to an optical pickup device employing hologram which is used in an optical disk device and the like.

2. Description of the Prior Art

An optical pickup device uses laser beam to record information in an optical recording disk such as an optical disk or read the information therefrom or detect servo signals. A prior art pickup device for a compact disk, for example, includes a semiconductor laser as a light source, a collimator lens for converting light emitted from the semiconductor laser into parallel beams, an objective lens for converging the parallel beams on the optical disk, a beam splitter for partially separating light reflected from the optical disk, a cylindrical lens for astigmatically converging light separated by the beam splitter, a detector receiving converged astigmatical light for detecting a recorded signal and a servo signal, and a photodetector for monitoring the power of laser beam which is partially reflected by the beam splitter on forward path from the semiconductor laser to the optical disk.

In this optical pickup device, however, the increasing number of components including the beam splitter leads to complicated device structure, and therefore, in recent years various optical pickup devices in which the beam splitter and the like are replaced with a hologram have been developed (see, for example, Japanese Unexamined Patent Publication No. 76035/1991 (G11B 7/135)).

FIG. 28 is a schematic diagram showing an optical pickup which employs the prior art hologram. The optical pickup has a first hologram 103 as a diffraction grating for splitting a laser beam on an optical path into three beams and a second hologram 104 for converting light reflected from an optical disk 101 so that the resultant wave front is astigmatical and then converting the light. Laser light from a semiconductor laser 102 emitting a laser beam upward is split into three beams by a first hologram 103, and the beams passing through a second hologram 104 is focused on the optical disk 101 by a focusing lens 105. A feedback beam obtained by reflecting the light from the optical disk 101 and converging the light with the wave front being astigmatical is detected by a photodetector 106 as a signal sensor.

In this optical pickup device, there is no loss of light since the feedback beam transmitted from the optical disk 101 and received by the light emitting element 106 is not diffracted by the first hologram 103, and the device can be miniaturized as compared with a device employing other elements like a prism since the second hologram 104 makes diffraction of the light leading to the photodetector 106 used as a signal sensor.

In the above-mentioned device, however, although it is necessary that the first hologram 103, the second hologram 104 and the photodetector 106 must be arranged in position and assembled cooperatively. Therefore, construction of these components is somewhat laborious, and adjustment in position among these components is also tedious work.

U.S. Pat. No. 5,018,804 discloses an optical pickup device which includes a diffraction grating for changing a direction of a laser beam emitted by a semiconductor laser at a right angle and a six-divided light detecting element for signal detection provided in a lower side position of the diffraction grating, so that the device can become thinner while grating intervals among hologram elements can be broadened.

However, since the components in this device are also independent of one another, there still remain the problems that construction of the components is laborious and that adjustment in correlated positions of those components is tedious work.

In addition to that, the prior art device has a disadvantage that since wire bonding pads of the semiconductor laser and the photodetector for signal detection are orthogonal in position or have a large difference in height to each other, wire bonding cannot be performed simultaneously to both of those elements.

SUMMARY OF THE INVENTION

An object of the present invention to provide an optical pickup device using a tracking servo by means of a three-beam method which is reliable in the tracking servo systems and where fabrication, adjustment in position, and the like of its components is facilitated.

Another object of the present invention is to reduce noise to a photodetector for signal detection and enhance accuracy of a tracking servo.

Further another object of the present invention is to eliminate offset to a tracking servo signal and enhance accuracy of the tracking servo.

Still another object of the present invention is to miniaturize an optical pickup.

Yet another object of the present invention is to provide a highly reliable and cost-reduced optical pickup device.

An optical pickup device according to the present invention includes a substrate having a major surface, a semiconductor laser provided on the surface of the substrate for emitting laser beam, a reflection-type diffraction grating oriented to the semiconductor laser for splitting the laser beam into at least three beams and reflecting them upward, a hologram for receiving three beams reflected from the reflection-type diffraction grating, a converging optical system for converging onto an optical recording medium the three beams transmitted by the hologram, and a photodetector for signal detection provided on the surface of the substrate for receiving on its top the three beams reflected from the optical recording medium and then converged by the hologram.

In the optical pickup device of the present invention, the reflection-type diffraction grating is utilized to split a laser beam into at least three beams and reflect them upward. The optical recording medium reflects the three beams, the transmission-type hologram diffracts the three beams toward a side of the reflection-type diffraction grating, and the photodetector for signal detection receives them on its top. Thus, a tracking servo by means of a three-beam method is available, and the device itself can be made thinner. The semiconductor laser and the element for signal detection are positioned on the same upper surface, and therefore, wire bonding to these elements can be facilitated. Moreover, since the three beams incident upon the signal detecting element are detected without being directed onto the reflection-type diffraction grating, there is no loss of light.

Furthermore, the optical pickup device according to the present invention may include another signal detecting element on the major surface of the substrate on which three beams diffracted by hologram toward the other side of the diffraction grating are directed from the above, or on an upper surface of an extra substrate in parallel with major surface.

In such an arrangement where there is provided another signal detecting element on the major surface of the substrate on which three beams diffracted by hologram toward the other side of the diffraction grating are directed from the above, or on an upper surface of an extra substrate in parallel with major surface, two signal detecting elements respectively detect a signal, and hence, reliability in signal detection is enhanced.

An optical pickup device in another aspect of the present invention includes a substrate having a major surface, a semiconductor laser provided on the surface of the substrate for emitting a laser beam sideways, a transmission-type diffraction grating oriented to the semiconductor laser on the surface of the substrate for splitting the laser beam into at least three beams, a hologram provided opposed to the transmission-type diffraction grating on the surface of the substrate for receiving three beams transmitted by the diffraction grating, a converging optical system for converging the three beams transmitted by the hologram onto an optical recording medium, and a photodetector for signal detection provided on the surface of the substrate with its photo detecting surface in parallel with the surface of the substrate for receiving the three beams reflected from the optical recording medium and converged by the hologram.

Preferably, the transmission-type diffraction grating may be provided on a substrate above the photodetector for signal detection, and a reflection surface is provided in a portion of the transmission-type diffraction grating to guide beams from the hologram toward the photodetector.

In this aspect of the present invention, the transmission-type diffraction grating splits a laser beam into at least three beams and guides them forward, and the transmission-type hologram converges three beams reflected from the optical recording medium and directs the focused beam to the photodetector. In this way, a tracking servo by means of a three-beam method is available.

The semiconductor laser, the photodetector for signal detection, the transmission-type diffraction grating, and the hologram are all displaced on the same surface of the same substrate, and thus, fabrication of these components and adjustment among them are facilitated.

Since the reflection surface is provided in the portion of the transmission-type diffraction grating to guide beams from the hologram toward the photodetector for signal detection, the beams can be directed to the photodetector from the above at a right angle, and thus, accuracy in signal detection is enhanced.

The foregoing and other objects, features, aspects and advantages of the present invention will become more apparent from the following detailed description of the present invention.

DESCRIPTION OF THE PREFERRED EMBODIMENTS

Figure 1:
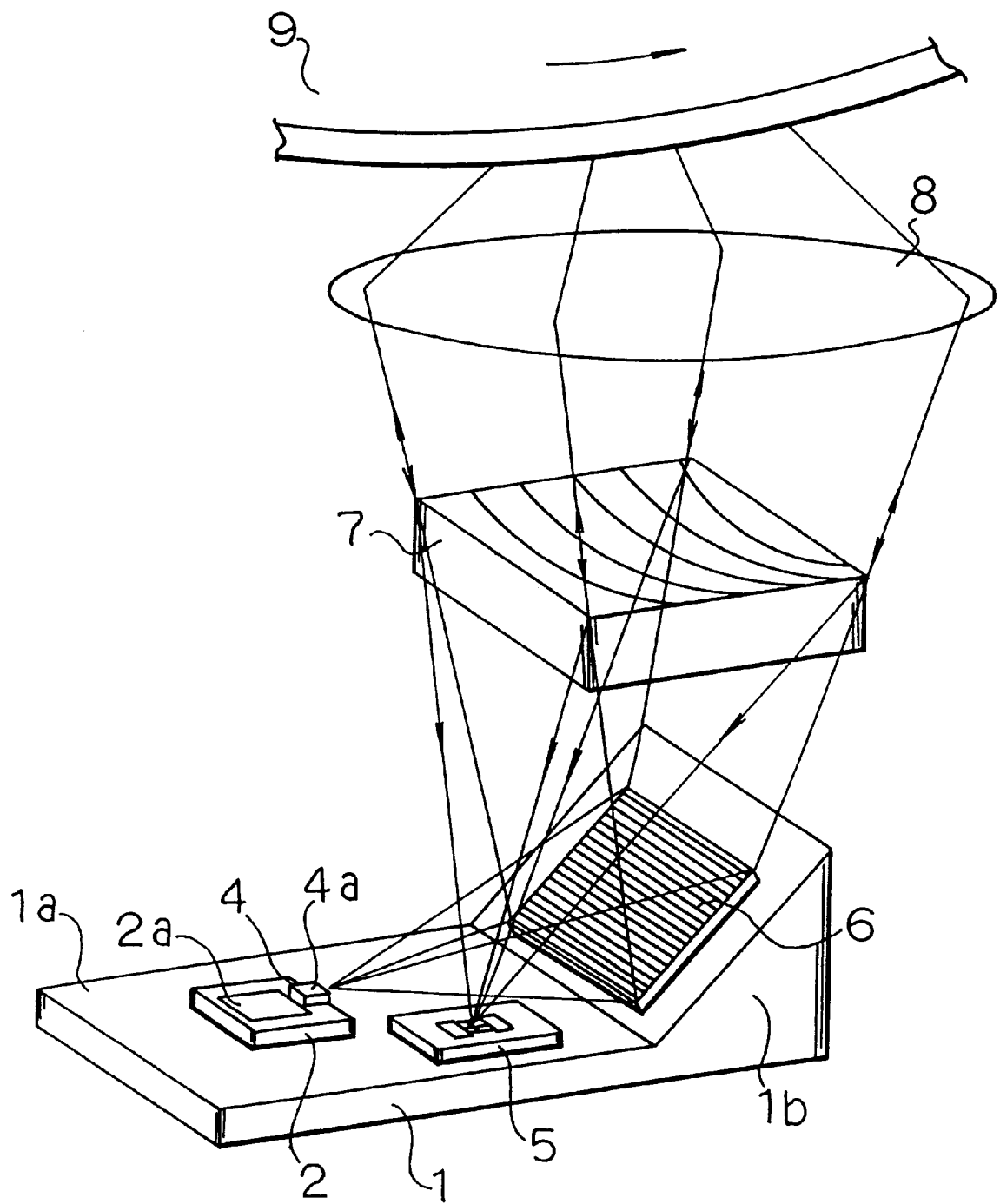
FIG. 1 is a perspective view showing an optical pickup device in a first preferred embodiment according to the present invention.
Figure 2:
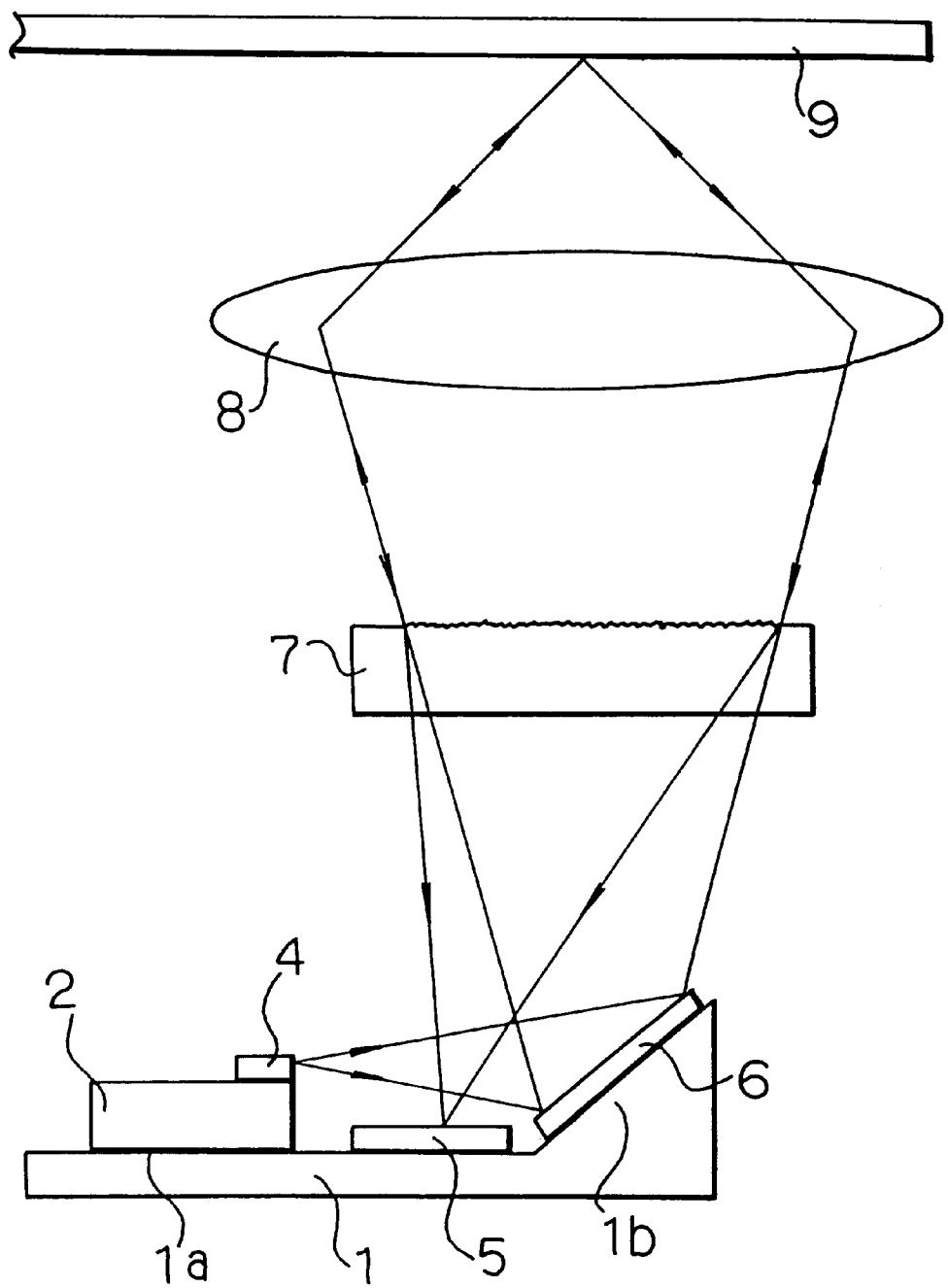
FIG. 2 is a schematic side view showing an arrangement of the optical pickup device in this embodiment.

An optical pickup device in a first preferred embodiment according to the present invention will now be described referring to the accompanying drawings. FIG. 1 is a schematic perspective view showing an optical pickup device, which provides a tracking servo by means of a three-beam method, in a first preferred embodiment according to the present invention, and FIG. 2 is a schematic diagram showing an arrangement of the optical pickup device. In FIGS. 1 and 2, electrodes, bonding wire and the like are omitted.

A substrate 1 with good heat conducting properties is made of conductive semiconductor material of such as $n^+Si$ (silicon), conductive metal such as copper, or insulating material including resin and ceramic with an electrode pattern. The substrate 1 has an upper major surface 1a and a sloping surface 1b with a bevel of 45 deg. The slope 1b is formed of same material as the substrate 1 or some material different from that of the substrate 1, in non-integrated unity; for example, this may be a glass right prism having its slant surface provided with a reflection-type diffraction grating.

An $n^+Si$ semiconductor substrate 2 forms a conductive heat sink on which a semiconductor laser 4 is mounted, and the semiconductor substrate 2 is fixed to the major surface 1a of the substrate 1 by means of die bonding and electrically connected to the substrate 1. On one end surface of the semiconductor substrate 2, a PIN type photo diode (light detecting unit) 2a is provided. The photo diode 2a is comprised of an $n^-$ type diffusion layer and a $p^+$ type diffusion layer selectively formed on a surface of the $n^-$ type diffusion layer, and it monitors power of the laser beam from the semiconductor laser 4.

The semiconductor laser 4 is fixed on the semiconductor substrate 2 in contact with its an electrode(not shown) by means of die bonding. The semiconductor laser 4 has another electrode 4a on its upper surface opposite to the surface fixed to the substrate 2. The semiconductor laser 4 has its fore facet oriented to the slope 1b. The semiconductor laser 4 emits a primary laser beam from its fore facet to detect signals from the optical recording medium and the laser beam (not shown) from its rear facet to monitor the laser output power.

A photodetector 5 for signal detection (signal detecting unit) detects a feedback beam (reflected light) returning from the optical recording medium to perform tracking servo, focusing servo and reproduction functions, and it is mounted on the upper major surface 1a of the substrate 1, the feedback beam enters the photodetector 5. The photodetector 5 is fixed on the substrate 1 in contact with an electrode (not shown) by means of die bonding, and thus, it is electrically connected to the photodetector 5.

A three-dividing reflection-type diffraction grating 6 is fixed to the slope surface 1b of the substrate 1. The three-dividing reflection-type diffraction grating 6 has gratings at uniform intervals and is oriented to the semiconductor laser 4, so that laser beam emitted sideways from the fore facet of the semiconductor laser 4 can be split into zeroth order and ±first-order diffraction beams and then reflected upward. In this embodiment, the zeroth order beam, +first order beam and –first order beam are respectively named main-beam, sub-beam X and sub-beam Y.

A transmission (light transmission) type hologram 7 is provided above the reflection type three-beam diffraction grating 6, and in this embodiment, the hologram 7 is formed of an assembly of curves, namely, gratings which are formed in an upper surface of a transparent substrate with pitches gradually varying. The hologram 7 transmits the zeroth order or main-beam(diffracts light in zeroth order), and ±first-order beams or sub-beams X and Y, and it further diffracts in first order the zeroth order and ±first order feedback beams (main-beam and sub-beams X and Y) reflected back from the optical recording medium to converge (focus) on a light detecting unit in the photodetector 5 beside the diffraction grating 6. The hologram 7 has an astigmatical effect according to which of the feedback beams diffracted in first order are converged so that their respective optical axes take slant positions to the axes of incident beams and their focal lengths vary from a first direction orthogonal to the direction of beam and a second direction orthogonal to the first direction. Thus, the hologram 7 has various functions as a beam splitter, a focusing lens, and a cylindrical lens.

Figure 3:
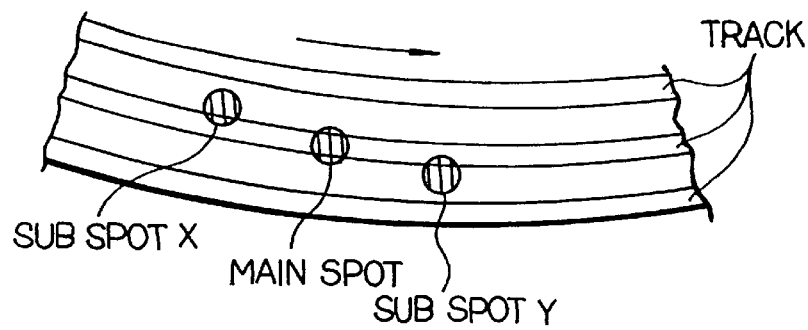
FIG. 3 is a diagram depicting tracks on an optical recording medium and a main spot and sub spots X and Y in this embodiment.

An objective lens 8 is positioned above the transmission-type hologram 7. The objective lens 8 converges the zeroth order and ±diffraction first order beams (main-beam and sub-beams X and Y) transmitted by the hologram 7 (i.e., diffracted in zeroth order) on surface of an optical recording medium 9 of an optical disk, such as a compact disk to form a main-beam spot and sub-beam spots X and Y on opposite sides of the main-beam spot, respectively. As shown in FIG. 3, an optical system in this optical pickup device is arranged and adjusted so that the main spot can scan a track to be reproduced while the sub spots X and Y can scan the opposite sides of the track on which main spot scan, slightly overlapping with that track. The objective lens 8 is controlled by a driving mechanism (not shown) based upon an error signal from the photodetector 5 to perform tracking servo and focusing servo.

Figure 4:
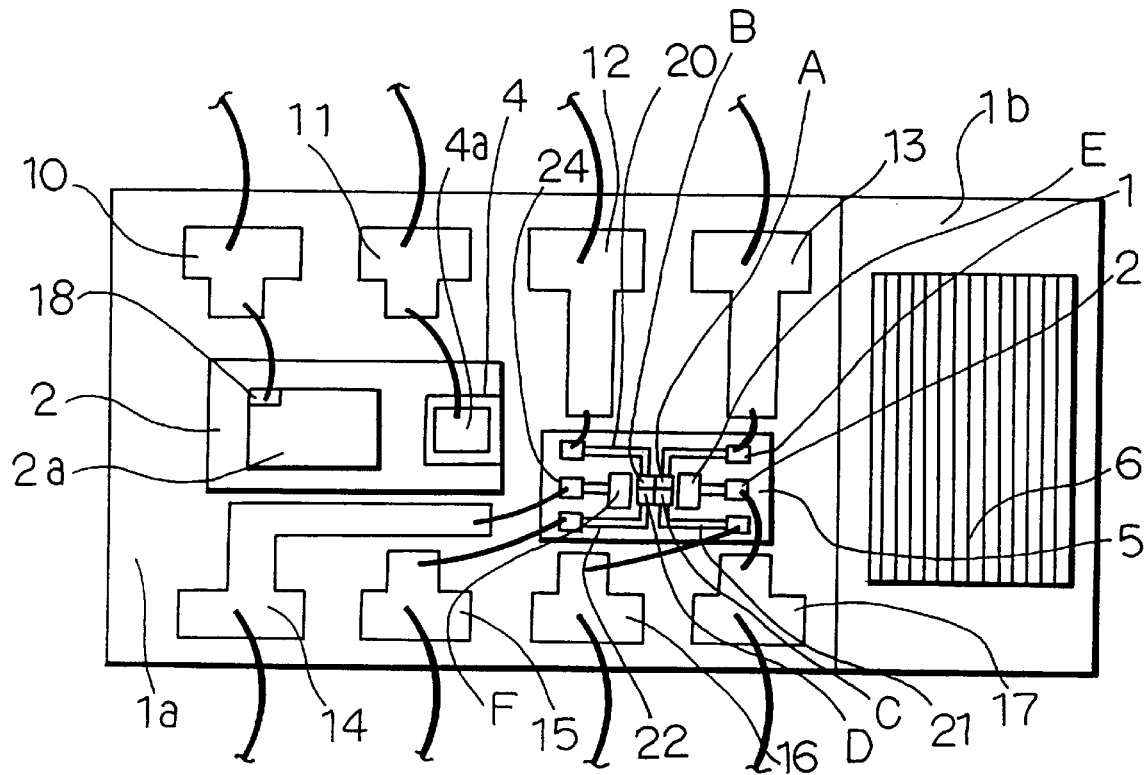
FIG. 4 is a plan view showing a substrate in this embodiment.

FIG. 4 is a plan view of the substrate 1 of the optical pickup device, illustrating in detail the electrodes, bonding wire and particulars of the photodetector 5.

As shown in FIG. 4, the photodetector 5 in this embodiment has four-divided light detecting units A, B, C and D at its center for performing a focusing servo function by means of an astigmatism method, and it receives the main-beam diffracted in first order by the hologram 7 on the center.

Figure 5:
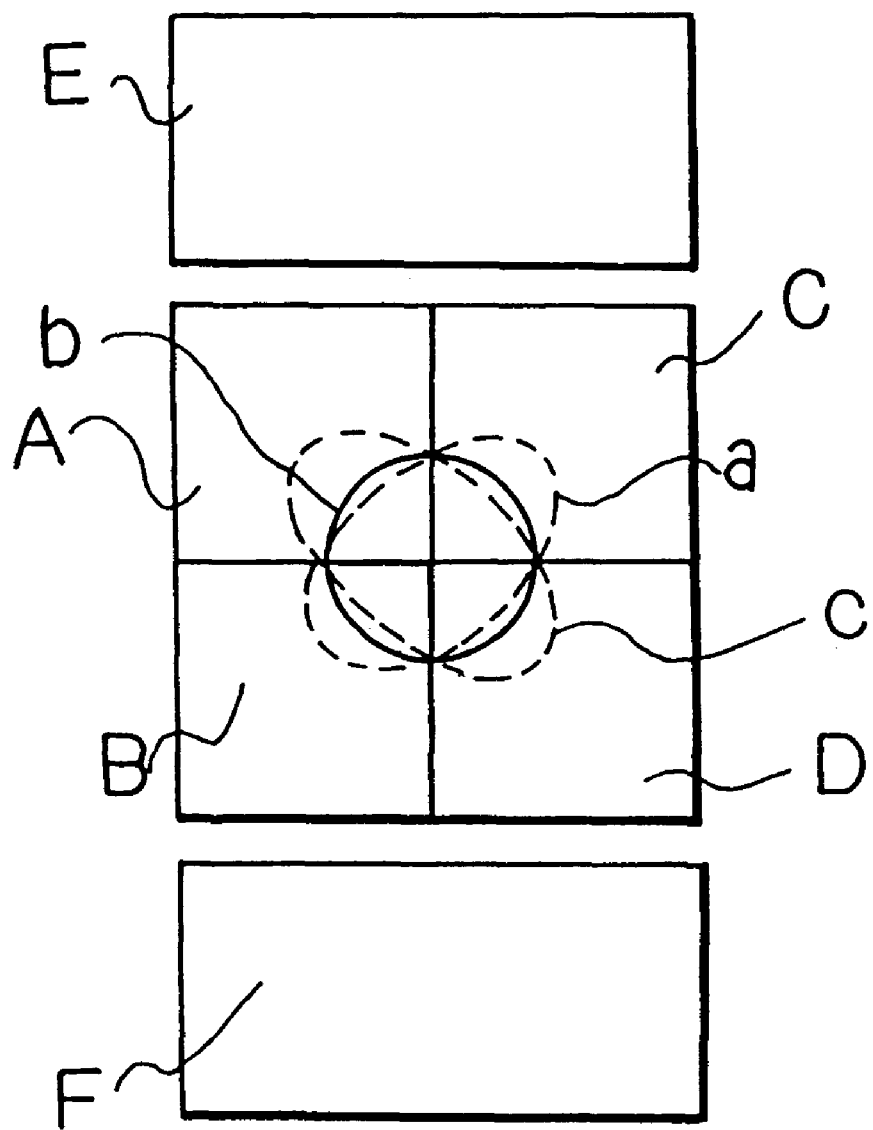
FIG. 5 is a plan view showing a light detecting element in this embodiment.

The first-order diffracted main-beam is astigmatical due to the hologram 7 as previous mentioned, and as schematically shown in FIG. 5, a spot obtained on the center (depicted by broken line "a") is an ellipse having a longer diameter aligned with a section between terminals of centers of the light detecting units B and C when the distance between the lens 8 and the optical recording medium 9 is too short. When the lens 8 and the optical recording medium 9 are cooperatively arranged so as to attain good focusing, the beams are focused in a circular spot (depicted by solid line "b") at the center of the light detecting units A, B, C and; On the contrary, when the distance between the lens 8 and the optical recording medium is too long, the beams are focused in an elliptical spot (depicted by broken line "c") having a longer diameter aligned with a section between terminals of centers of the light detecting units A and D. Thus, a focusing error (FE) signal includes an amount of focus deviation, a positive signal represents an undesirably short distance between the lens 8 and the optical recording medium 9, a zero signal a good focusing, and a negative signal an undesirably long distance.

$$FE\ signal = (A1+D1)-(B1+C1) \tag{1}$$

When the main spot tracks well, the sub-beams X and Y incident upon light detecting units E and F are equal in intensity; otherwise, when the main spot deviates either side of the track to be reproduced, one of the sub-beams X and Y becomes larger in intensity. Thus, in accordance with a tracking error (TE) signal, information about the amount of deviation or about which side of the track the spot deviates from is obtained based upon the following formula (2) by an operating circuit not shown:

$$TE\ signal = E1 - F1 \tag{2}$$

A reproducing signal is obtained based upon the following formula (3) calculated by an operating circuit not shown:

$$Reproducing\ signal = A1 + B1 + C1 + D1 \tag{3}$$

A1 to F1 in the above formulas are intensities of the detection signal in the light detecting units A to F.

FIG. 4 depicts the electrode, bonding wire and the like. Relay electrodes 10 to 17 made of gold and the like are formed on the upper surface 1a of the substrate 1 with an insulating layer $SiO_2$ (not shown) interposed therebetween. An electrode 18 of the photo diode 2a is also made of gold and the like. Second electrodes 19 to 24 of the light detecting units A to F in the photodetector 5 are also made of gold and the like. The electrode 4a of the semiconductor laser 4, the electrode 18 of the photo diode 2a, the second electrodes 19 to 24 of the photo detecting units A to F are electrically connected to the corresponding relay electrodes 10 to 17 through bonding wire (thick line in FIG. 4) made of gold and the like, respectively, and the relay electrodes 10 to 17 are electrically connected to the operating circuits and the like (not shown) through the bonding wire (thick line in FIG. 4) made of gold and the like. The semiconductor laser 4, the light detecting units A to F of the photodetector 5, and the photo diode 2a are electrically connected to a common electrode (not shown) formed on the reverse side of the substrate 1. Reproduction, tracking servo, focusing servo and other functions are performed in this optical pickup device in the manner as follows.

Laser light emitted from the rear facet of the semiconductor laser 4 is received by the photo diode 2a and is controlled based upon a signal according the quantity of detected power light by an APC (automatic power control) circuit so as to keep the power of the laser beam constant.

On the other hand, the laser beam emitted from the fore facet of the semiconductor laser 4 is split into several beams including zeroth order and ±first order diffracted beams (main-beam and sub-beams X and Y) and reflected upward at a right angle by the reflection-type diffraction grating 6. The zeroth order and ±first order diffracted beams (main-beam and sub-beams X and Y) reflected upward are directed to one side of the transmission-type hologram 7. After that, the beams diffracted (transmitted) in zeroth order by the hologram 7 (main-beam and sub-beams X and Y) are converged (focused) in the above-mentioned main-beam spot and sub-beam spots X and Y on the optical recording medium 9 by the objective lens 8. The feedback beams (main-beam and sub-beams X and Y) carrying information signals from the main spot and sub spots X and Y, after passing through the objective lens 8, are diffracted in first order by the transmission-type hologram 7, and the main-beam is directed to the four segment photodetector A to D in the photodetector 5 while the sub-beams X and Y are respectively directed to the segments of the photodetector E and F. Thus, signals obtained by the photodetector 5 are arithmetically operated on by the operating circuits (not shown) to produce the reproducing signal, the FE signal and the TE signal. Based upon the FE signal and the TE signal, the objective lens 8 is controlled by a driving mechanism (not shown) to perform tracking servo functions and focusing servo.

In this optical pickup device, the reflection-type diffraction grating 6 splits the laser beam into zeroth order and ±first order diffracted beams (main-beam and sub-beams X and Y) and reflects them upward. The three beams, after being reflected from the optical recording medium 9, are diffracted in first order toward the side of the reflection-type diffraction grating 6 by the hologram 7, and the main-beam is directed from the above to the light detecting units A to D while the sub-beams X and Y are directed from above to the light detecting units E and F, respectively. Thus, a tracking servo in the three-beam method can executed, and the device itself can be made thinner.

The semiconductor laser 7 and the photodetector 5 for signal detection are provided on the same surface 1a, and hence, wire bonding of these elements are facilitated.

As mentioned above, the present invention provides a highly reliable optical pickup because the components are fabricated on the same substrate and tracking servo by means of a three-beam method is adopted. Furthermore, the present invention provides a cost-reduced optical pickup because fabrication of the components is facilitated.

Although, in the above mentioned embodiment, the main-beam and sub-beams X and Y diffracted in first order by the hologram 7 are directed to the photodetector 5, the main-beam and sub-beams X and Y diffracted in −first order may be directed to the photodetector 5.

Figure 6:
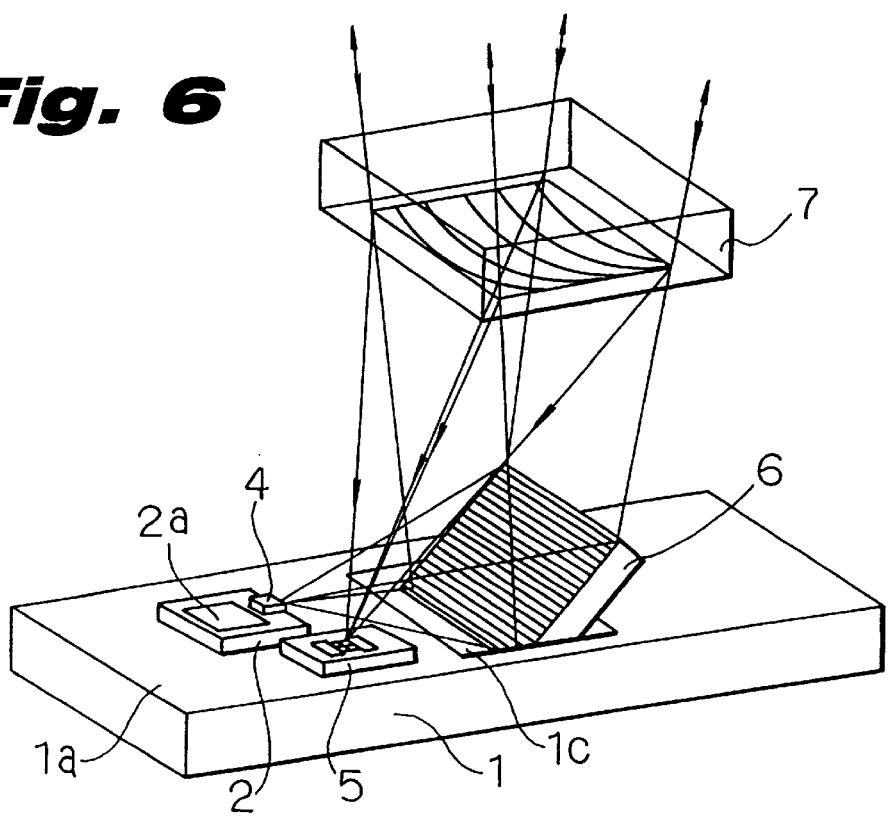
FIG. 6 is a perspective view showing an arrangement of an optical pickup device in a second preferred embodiment according to the present invention.
Figure 7:
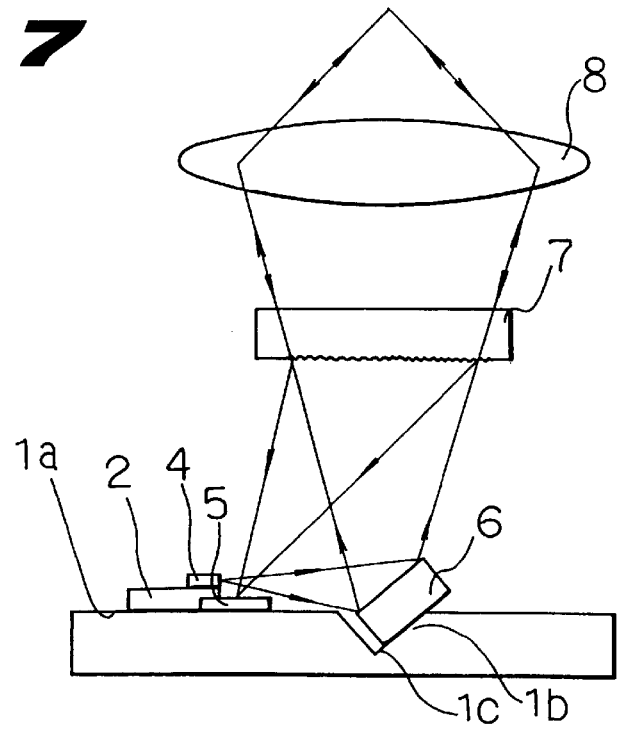
FIG. 7 is a schematic side view showing the arrangement of the optical pickup device in this embodiment.

An optical pickup device of a second preferred embodiment according to the present invention will now be described with reference to the drawings. FIG. 6 is a perspective view showing an arrangement of the optical pickup device where tracking servo by means of the three-beam method and focusing servo by means of an astigmatism method are available, and FIG. 7 is a schematic side view showing the optical pickup device. This embodiment is different from the first preferred embodiment in that a depression having an inner slope is provided in the substrate 1 and that the diffraction grating 6 is mounted on the slope inside the depression. Like reference numerals denote like and corresponding parts to those discussed in conjunction with the first preferred embodiment, and explanation about them is omitted for simplification of explanation. In these figures, electrodes and some other components are omitted.

In FIG. 6 and FIG. 7, similar to the first preferred embodiment, a substrate 1 is made of conductive semiconductor material of $n^+Si$ (silicon), conductive metal such as copper, or insulating material including resin and ceramic with an electrode pattern, and the substrate 1 has a depression 1c in its upper major surface 1a formed, and the depression 1c has a slope 1b with a bevel of 45 deg. The diffraction grating 6 has gratings at equal intervals as mentioned before, and it is oriented to a semiconductor laser 4. Thus, the laser beam emitted sideways from a fore facet of the semiconductor laser (laser diode) 4 is split into zeroth order and ±first order diffracted beams and those beams are reflected upward by the diffraction grating 6.

In this embodiment, a hologram 7 positioned above the diffraction grating 6 is formed of an assembly of curves, namely, grating which are formed in a lower surface of a translucent substrate with pitches gradually varying. The hologram 7 transmits the zeroth order or main-beam, and ±first-order beams or sub-beams X and Y (diffracts light in zeroth order), and it further diffracts in first order the zeroth order and ±first order feedback beams (main-beam and sub-beams X and Y) reflected back from an optical recording medium to converge (focus) on a light detecting unit in a photodetector 5 beside the diffraction grating 6.

Reproduction tracking servo and focusing servo are performed similar to those in the first preferred embodiment. Laser light emitted from a rear facet of the semiconductor laser 4 is received by a photo diode 2a, and an APC (automatic power control) circuit (not shown) controls the power of the laser beam based upon a signal corresponding to the quantity of received light so as to keep the power constant.

On the other hand, the laser beam emitted from the fore facet of the semiconductor laser 4 is split into several beams including zeroth order and ±first order diffracted beams (main-beam and sub-beams X and Y) and reflected upward at a right angle by the reflection-type diffraction grating 6. The zeroth order and ±first order diffracted beams (main-beam and sub-beams X and Y) reflected upward are directed to the transmission-type hologram 7 from its one side. After that, the zeroth order and ±first order diffracted beams (main-beam and sub-beams X and Y) diffracted in zeroth order (transmitted) by the hologram 7 are converged (focused) in a main-beam spot and sub-beam spots X and Y on an optical recording medium 9 by an objective lens 8. Feedback beams (main-beam and sub-beams X and Y) carrying information signals from the main spot and sub spots X and Y, after passing through the objective lens 8, are diffracted in first order by the transmission-type hologram 7, and the main-beam and the sub-beams are directed to light detecting units in specified regions in the photodetector 5 similar to the above case. Then, signals obtained by the photodetector 5 are arithmetically processed by operating circuits (not shown) to produce the reproducing signal, the FE signal and the TE signal. Based upon the FE signal and the TE signal, the objective lens is controlled by a driving mechanism (not shown) to perform tracking servo and focusing servo.

In this optical pickup device, similar to the first preferred embodiment, the reflection-type diffraction grating 6 splits the laser beam into zeroth order and ±first order diffracted beams (main-beam and sub-beams X and Y) and reflects the beams upward. The three beams reflected from the optical recording medium 9 are diffracted in first order near to the reflection-type diffraction grating 6 by the hologram 7; the main-beam is directed from above to light detecting units A to D while the sub-beams X and Y are directed to light detecting units E and F from above, respectively. In this way, a tracking servo by means of the three-beam method is available, and the device itself can be made thinner.

Since the semiconductor laser 4 and the photodetector 5 for signal detection are provided on the same surface 1a, wire bonding to these elements are facilitated.

As mentioned above, the present invention provides a highly reliable optical pickup because the components are fabricated on the same substrate and because a tracking servo by means of a three-beam method is adopted. Furthermore, the present invention provides a cost-reduced optical pickup because fabrication of the components is facilitated.

Although, in this embodiment, the main-beam and sub-beams X and Y diffracted in first order by the hologram 7 are directed onto the photodetector 5, the main-beam and the sub-beams X and Y diffracted in −first order may be directed onto the photodetector 5.

Figure 8:
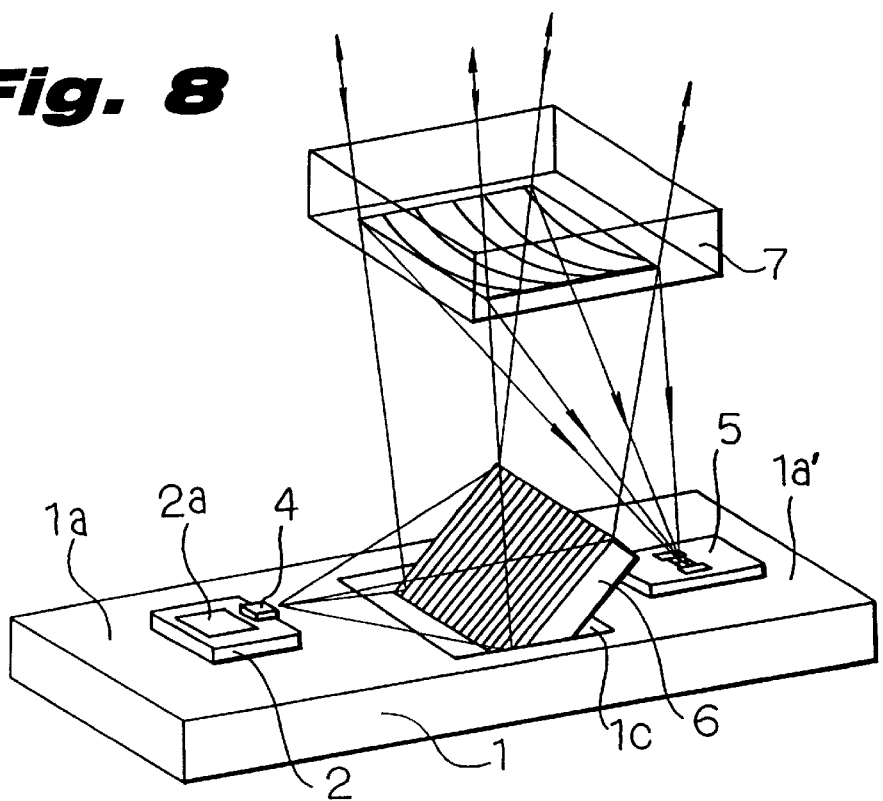
FIG. 8 is a perspective view showing an arrangement of an optical pickup device in a third preferred embodiment according to the present invention.
Figure 9:
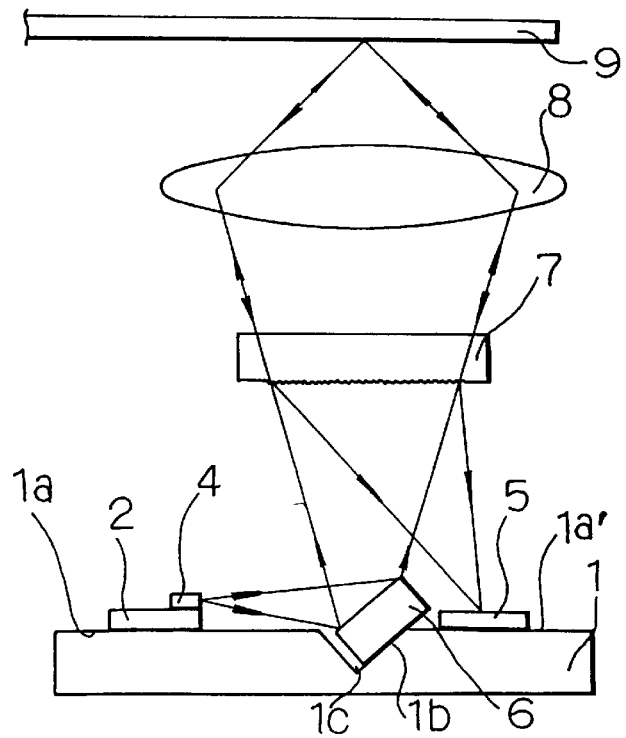
FIG. 9 is a schematic side view showing the arrangement of the optical pickup device in this embodiment.

An optical pickup device of a third preferred embodiment according to the present invention will now be described with reference to the drawings. FIG. 8 is a perspective view showing an arrangement of the optical pickup device where tracking servo by means of the three-beam method and focusing servo by means of an astigmatism method are available, and FIG. 9 is a schematic side view showing the optical pickup device. This embodiment is different from the second preferred embodiment in that a photodetector for signal detection is mounted on an upper surface of the substrate 1 close to a back side of the diffraction grating 6, that is, the semiconductor laser, the diffraction grating, and the photodetector are aligned. Like reference numerals denote like and corresponding components to those in the first and second preferred embodiments for simplification of explanation. Electrodes and some other components are omitted in these figures.

In FIG. 8 and FIG. 9, a substrate 1 is made of conductive semiconductor material of $n^+Si$ (silicon), conductive metal such as copper, or insulating material including resin and ceramic with an electrode pattern, and the substrate 1 has a depression 1c formed in its upper major surface 1a and the depression 1c is provided with a slope 1b with a bevel of 45 deg. To the slope 1c, the diffraction grating 6 is fixed. The diffraction grating 6 is, as mentioned above, includes gratings at equal intervals and is oriented to a semiconductor laser 4. The diffraction grating 6 splits the laser beam emitted sideways from a fore facet of the semiconductor laser (laser diode) 4 into zeroth order and ±first order diffracted beams and reflects them upward. A photodetector 5 is positioned on an upper surface 1a' of the substrate 1 close to the back side of the diffraction grating 6, aligned with the semiconductor laser 4 and the diffraction grating 6. The photodetector 5 is mounted behind the back side of the diffraction grating 6 so as to block direct incident beams from the semiconductor laser 4. The photodetector 5 receives only the feedback beam.

In the first and second preferred embodiments, however, although the photodetector 5 is positioned on the upper surface 1a of the substrate 1 which no beam other than the feedback beams enter, the photodetector 5 receives some of the direct laser beams a from the semiconductor laser 4 because of scattering of the laser beams from the semiconductor laser 4.

A hologram 7 positioned above the diffraction grating transmits the zeroth order or main-beam, and ±first order beams or sub-beams X and Y (i.e., it diffracts beams in zeroth order), and it further diffracts zeroth order and ±first order feedback beams (main-beam and sub-beams X and Y) reflected back from an optical recording medium in first order to converge (focus) them to a light detecting unit of the photodetector 5 behind the back side of the diffraction grating 6.

Reproduction and tracking servo in this optical pickup device are performed in a manner similar to that in the first preferred embodiment. Laser light emitted from a rear facet of the semiconductor laser 4 is received by a photo diode 2a, and an APC (automatic power control) circuit (not shown) controls power of the laser beam based upon a signal corresponding the quantity of received light so as to keep the power of the laser beam constant.

On the other hand, the reflection-type diffraction grating 6 splits the laser beam emitted from a fore facet of the semiconductor laser 4 into several beams including zero and ±first order diffracted beams (main-beam and sub-beams X and Y) and reflects them upward at a right angle. The zeroth order and ±first order diffracted beams (main-beam and sub-beams X and Y) reflected upward are directed to the transmission-type hologram 7 from its one side. After that, the zeroth order and ±first order diffracted beams (main-beam and sub-beams X and Y) diffracted in zeroth order (transmitted) by the hologram 7 are converged (focused) in the previously mentioned main-beam spot and sub-beam spots X and Y by an objective lens 8. Feedback beams (main-beam and sub-beams X and Y) carrying information signals from the main spot and sub spots X and Y, after passing through the objective lens 8, are diffracted in first order by the transmission-type hologram 7, and the main-beam and sub-beams are directed to light detecting units in specified regions in the photodetector 5 mounted behind the diffraction grating 6, as in the above-mentioned manner. Signals obtained by the photodetector 5 are arithmetically processed by operating circuits not shown to produce the above-mentioned reproducing signal, FE signal and TE signal. The objective lens 8 is controlled by a driving mechanism (not shown) based upon the FE signal and TE signal to perform tracking servo and focusing servo.

Figure 10:
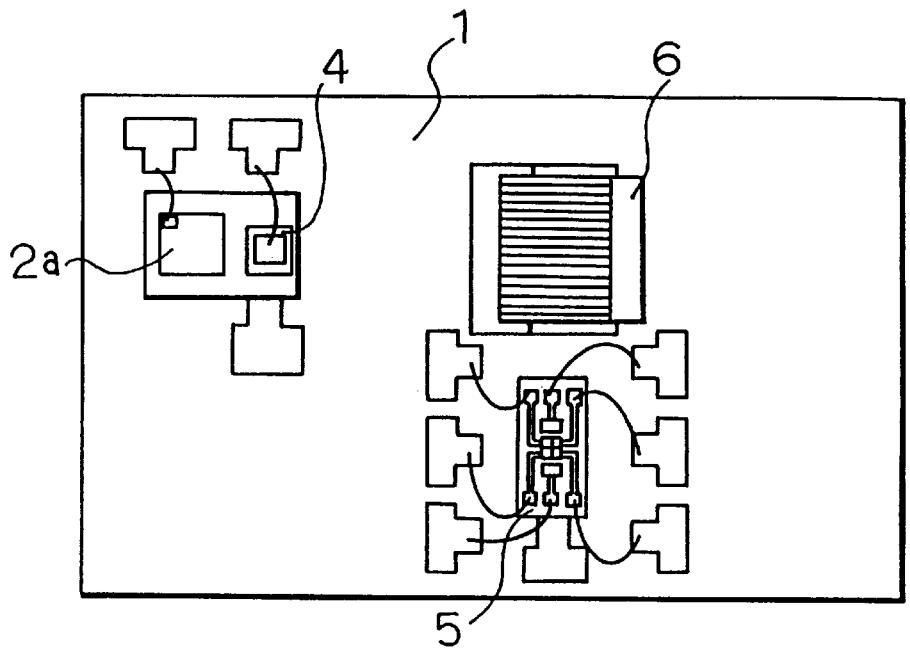
FIG. 10 is a schematic plan view showing one possible arrangement of the optical pickup device according to the present invention.
Figure 11:
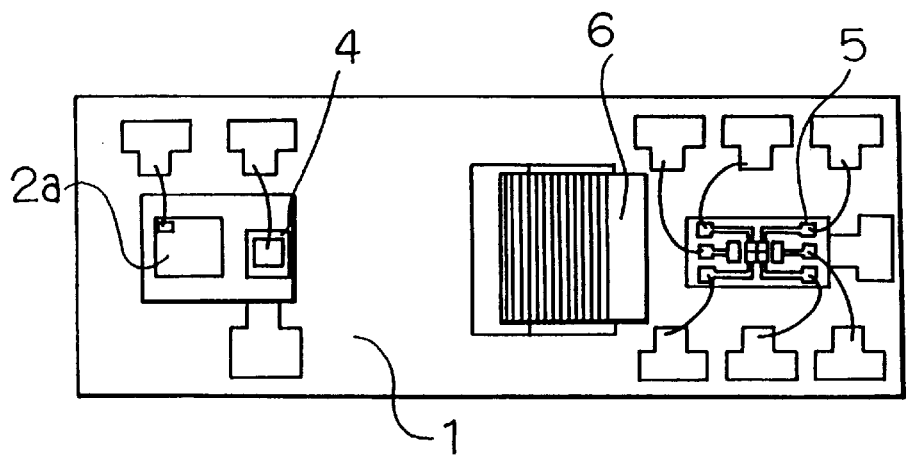
FIG. 11 is a schematic plan view showing another possible arrangement of the optical pickup device according to the present invention.
Figure 29:
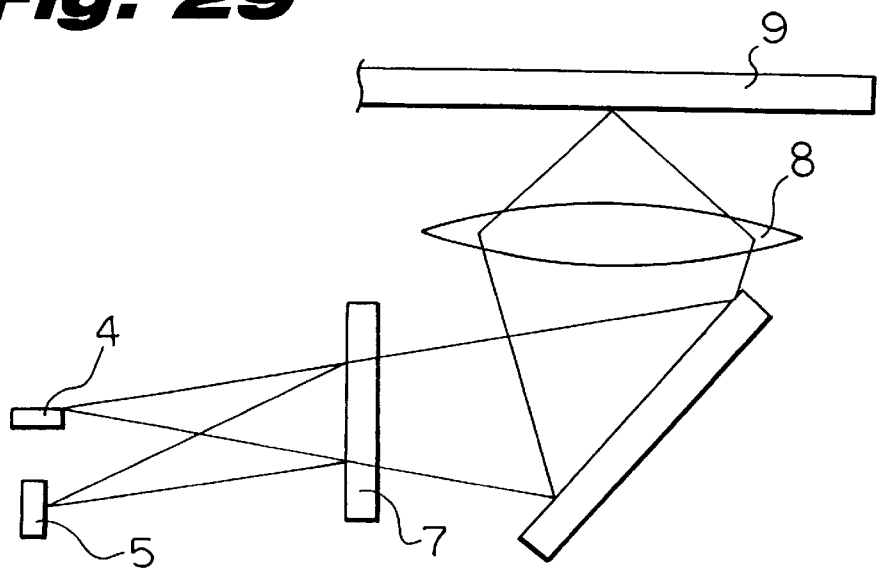
FIG. 29 is a schematic diagram showing an arrangement of an optical pickup device.

Usually, the distance between a light source (semiconductor laser 4) and the objective lens 8 must be a certain length. For example, a compact disk requires about 20 mm. In order to obtain a thin optical pickup device, the hologram 7 and the objective lens 8 are not to be aligned as shown in FIG. 9 but to be arranged, as shown in FIG. 29, so that a reflection mirror is provided between the hologram 7 and the objective lens 8 with a face of the hologram 7 being orthogonal with a face of the objective lens 8. In FIG. 29, a three-dividing diffraction grating is omitted. Thus, in order to assemble the semiconductor laser 4, the diffraction grating 6, the photodetector 5 and the hologram 7 in a unit, as shown in FIGS. 10 and 11, the unit is oriented to an optical recording medium 9. As will be recognized in FIGS. 10 and 11, for the purpose of obtaining a small device, the photodetector 5 is preferably placed in alignment with the semiconductor laser 4 and a diffraction grating 6 rather than placed to one side of the diffraction grating 6.

Figure 12A:
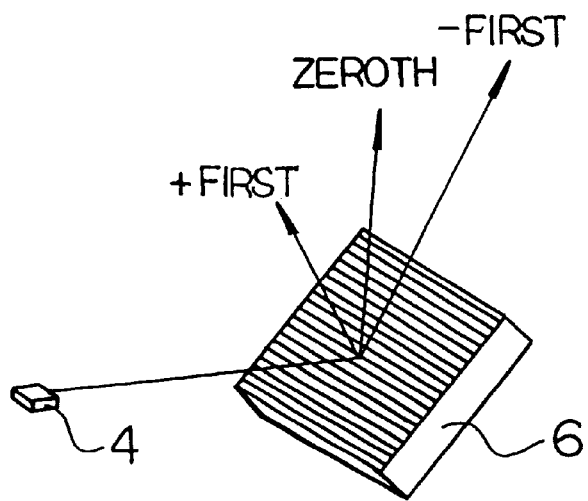
FIG. 12A and FIG. 12B are diagrams illustrating orientations between a diffraction grating and the laser beam.
Figure 12B:
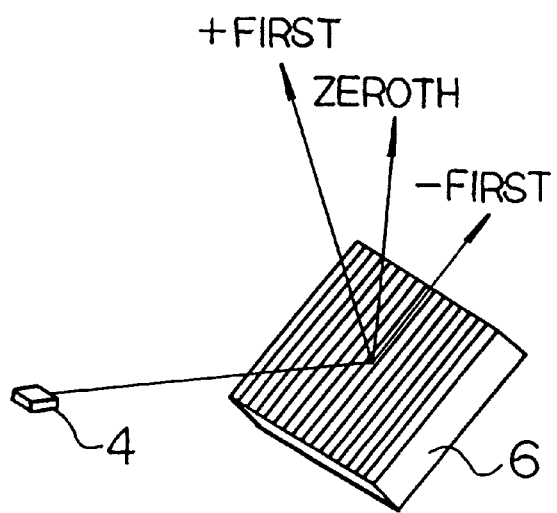
Figure 13A:
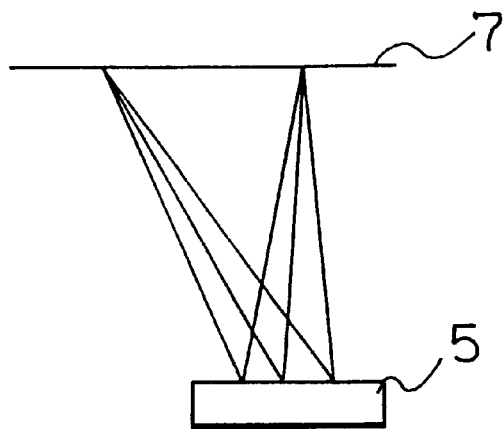
FIG. 13A and FIG. 13B are diagrams illustrating incident angles of light between a hologram and a photodiode.
Figure 13B:
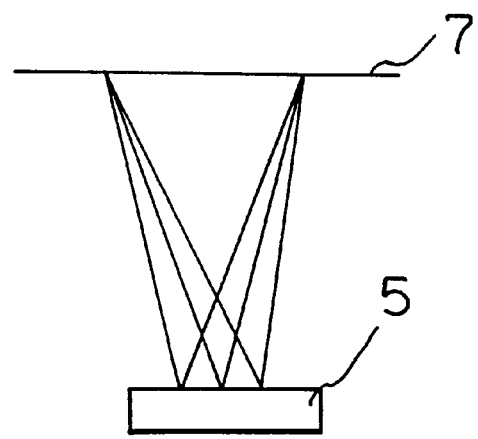

The reflection-type diffraction grating is to be oriented in two ways as shown in FIGS. 12A and 12B. An orientation of the diffraction grating shown in FIG. 12A causes difference in diffraction angles from +first diffraction beam to −first diffraction beam, and this causes variations in wave shape front, which eventually leads to variations in beam characteristics from beam to beam. If such beams are used to detect a tracking error signal, offset arises in the signal. As to an orientation shown in FIG. 12B, since the diffraction angles are symmetrical between plus and minus, the beam characteristic becomes uniform. Moreover, the hologram 7 diffracts beams in two ways as shown in FIG. 13A and FIG. 13B. Referring to FIG. 13A, since incident angles upon the photodetector 5 vary from +first-order beam to −first-order beam, new offset is likely to occur in the tracking error signal when the optical recording medium is tilted. Meanwhile, referring to FIG. 13B, since the incident angles are symmetrical, offset does not easily occur. Allowing for the above, the arrangements shown in FIGS. 12B and 13B, and the arrangement where the semiconductor laser 4, the diffraction grating 6 and the photodetector 5 are aligned with each other are preferable.

In the optical pickup device of the third preferred embodiment, similar to the first and second preferred embodiments, the reflection-type diffraction grating 6 splits the laser beam into zeroth order and ±first order diffracted beams (main-beam and sub-beams X and Y) and reflects the beams upward, and the hologram 7 diffracts in first order the three beams reflected from the optical recording medium 9 behind the reflection-type diffraction grating 6; the main-beam is directed from above to light detecting units A to D while the sub-beams are respectively directed from above to light detecting units E and F. In this way, tracking servo by means of the three-beam method is available, and the device itself can be made thinner.

The semiconductor laser 4 and the photodetector 5 for signal detection are provided on the same surface 1*a*, and therefore, wire bonding of these components is facilitated.

As mentioned above, the present invention provides a highly reliable optical pickup because the components are fabricated on the same substrate and because tracking servo by means of a three-beam method is adopted. Furthermore, the present invention provides a cost-reduced optical pickup because fabrication of the components is facilitated.

Although, in this embodiment, the main-beam and sub-beams X and Y diffracted in first order by the hologram 7 are directed to the photodetector 5, those beams diffracted in −first order may be received by the photodetector 5.

Figure 14:
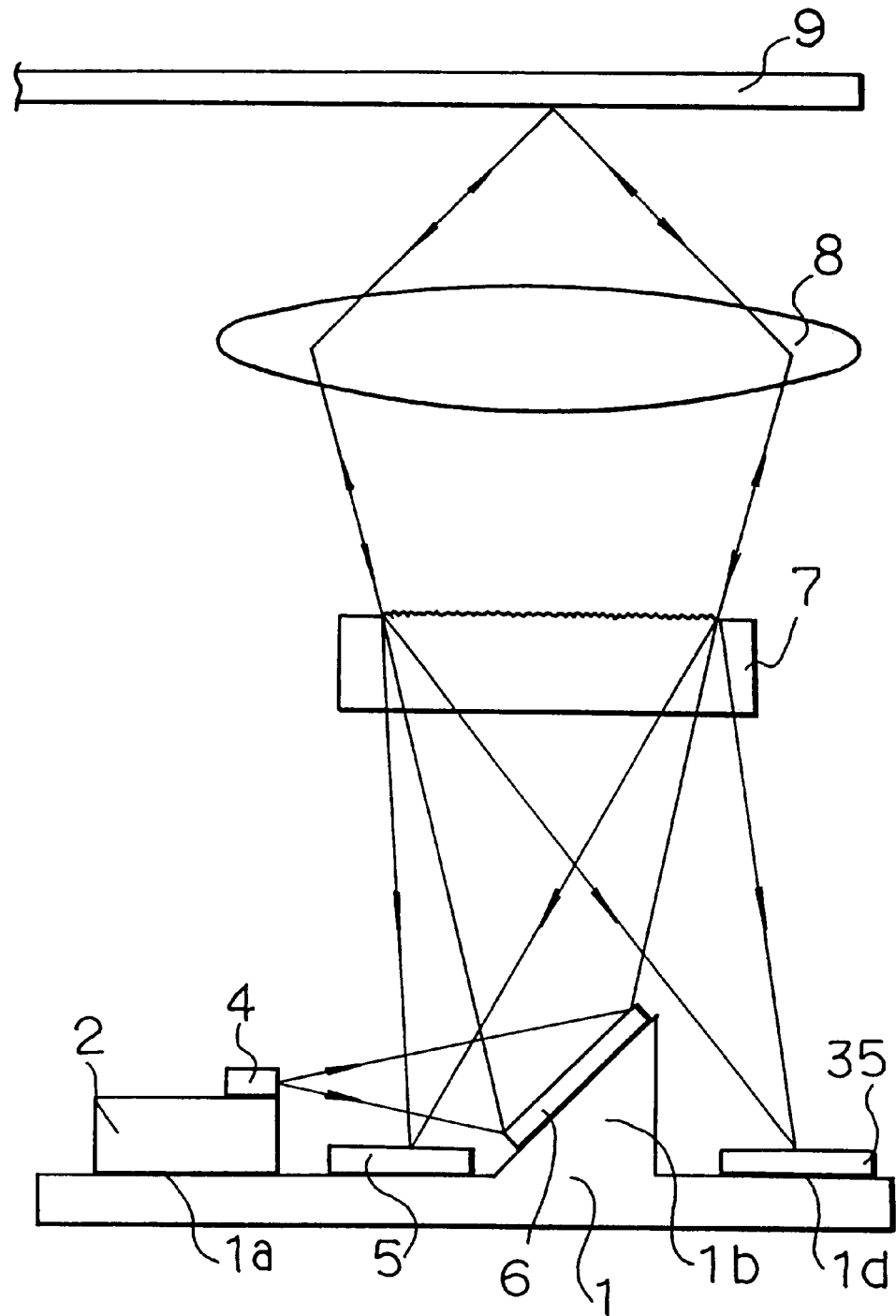
FIG. 14 is a side view 'showing an optical pickup device in a fourth preferred embodiment according to the present invention.

An optical pickup device of a fourth preferred embodiment according to the present invention will now be described with reference to the drawings. FIG. 14 depicts an arrangement of the optical pickup device in this embodiment, where tracking servo by means of the three-beam method and focusing servo by means of an astigmatism method are available. This embodiment is different from the first preferred embodiment in that there is provided another upper surface behind a slope of the substrate 1 and that a photodetector is also mounted on this upper surface. Like reference numeral denote like and corresponding parts to those in the first preferred embodiment, and explanation about those parts is omitted for simplification of the following discussion. In FIG. 14, electrodes and some other components are omitted.

In FIG. 14, the substrate 1 is made of conductive semi-conductor material of $n^+Si$ (silicon), conductive metal such as copper, or insulating material including resin and ceramic with an electrode pattern, and the substrate 1 has a first upper surface 1*a*, a second upper surface 1*d*, and a slope 1*b* with a bevel of 45 deg between the first and second upper surfaces.

A photodetector 35 for signal detection is fixed to the second upper surface ld by means of die bonding so as to be in contact with an electrode not shown, and it is formed in the same manner as the photodetector 5 in the first preferred embodiment which is electrically connected to the substrate 1. Zero order and ±first order feedback beams (main-beam and sub-beams X and Y) reflected back from an optical recording medium 9 are diffracted in −first order by a hologram 7 and converged (focused) onto the photodetector 35 behind a diffraction grating 6.

In such an optical pickup device, tracking servo by means of the three-beam method is available as in the first preferred embodiment, and the device itself can be made smaller. Furthermore, wire bonding of a semiconductor laser 4 and the photodetectors 5 and 35 for signal detection to each relay electrodes is facilitated.

In addition, an adding circuit (not shown) adds a signal obtained from the photodetector 5 by detecting feedback beams diffracted in +first order by a hologram 7 and a signal obtained from the photodetector 35 by detecting feedback beams diffracted in −first order by the hologram 7, and based upon the resultant addition signal, tracking servo by means of the three-beam method and focusing servo by means of the astigmatism method are performed. Consequently, intensity of detected signals based upon the feedback beams becomes larger compared with that in the first preferred embodiment, and reliability of detection is enhanced.

If two photodetectors are used as in the fourth preferred embodiment, feedback beams diffracted in +first order by a hologram are focused on one of those photodetector while feedback beams diffracted in −first order are focused on the other, and the photodetectors are appropriately arranged on the substrate 1 at which no beam other than the feedback beams enter.

As mentioned above, the present invention provides a highly reliable optical pickup because the components are fabricated on the same substrate and because tracking servo by means of a three-beam method is adopted. Furthermore, the present invention provides a cost-reduced optical pickup because fabrication of the components is facilitated.

Although, in the first to fourth preferred embodiments, the semiconductor laser and photodetector(elements) are provided on the same surface, the photodetector(elements) may be provided on an additional upper surface formed in parallel with the original upper surface. Although construction of the components is relatively easy in the first and fourth preferred embodiments, since they are provided on the same surface, construction of the components is increasingly facilitated if an additional upper surface is provided at a different level from the original upper surface in parallel with it, because the additional upper surface is used as a base for mounting the components.

Although, in the first to fourth preferred embodiment, the photodetectors 5 and 35, and the substrate 2 having the photo diode 2a and the like are provided on the substrate 1 as separate units, these components or at least one of them may be formed, like the photo diode 2, directly in the substrate 1 as a light detecting unit by means of semiconductor process such as a diffusion method. In such a case, after the light detecting unit is first formed in the plate-shaped substrate 1 by means of semiconductor fabrication process, a slope piece to support the diffraction grating may be attached thereto by an adhesive agent or the like.

When an insulating material is used for the substrate 1, a common electrode cannot be provided on the reverse side of the substrate 1, and thus, an electrode replaced with this must be formed in the upper surface of the substrate 1. As will be recognized, there are several variations in electrode arrangement.

As to the reflection-type diffraction grating and transmission-type hologram, diffraction of beams in second or higher order is also performed, and it is desirable to set an optical system so as to block diffracted beams in second or higher order. However, since beams diffracted in second or higher order are very weak in intensity, no serious problem arises even if the beams enter the light detecting unit. Although there is a choice of appropriate position of the light detecting unit as previously mentioned, a grating configuration of the transmission-type hologram must be changed if the position of the light detecting unit is changed.

Additionally, the optical pickup device may be molded of transparent (translucent) resin to avoid condensation from humidity or to reduce production cost.

Figure 15:
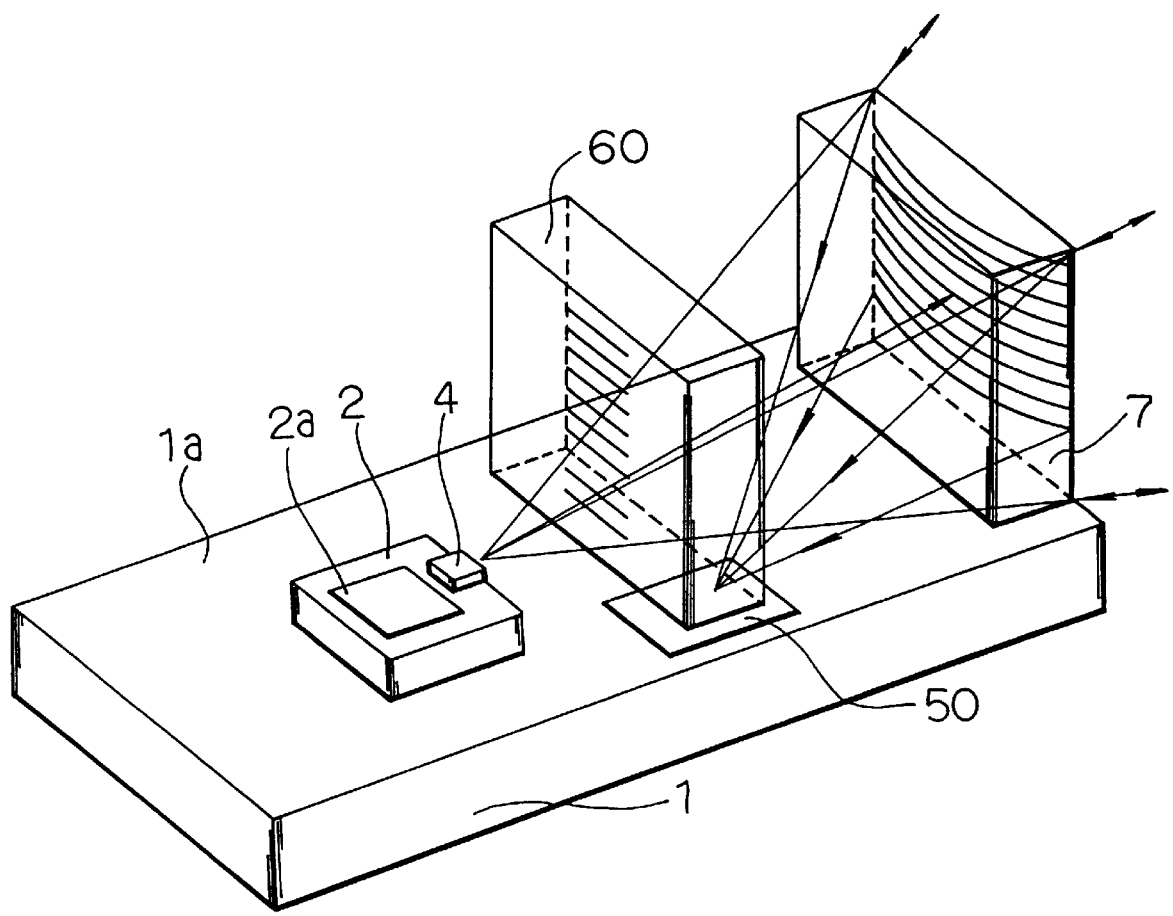
FIG. 15 is a perspective view showing an optical pickup device in a fifth preferred embodiment according to the present invention.
Figure 16:
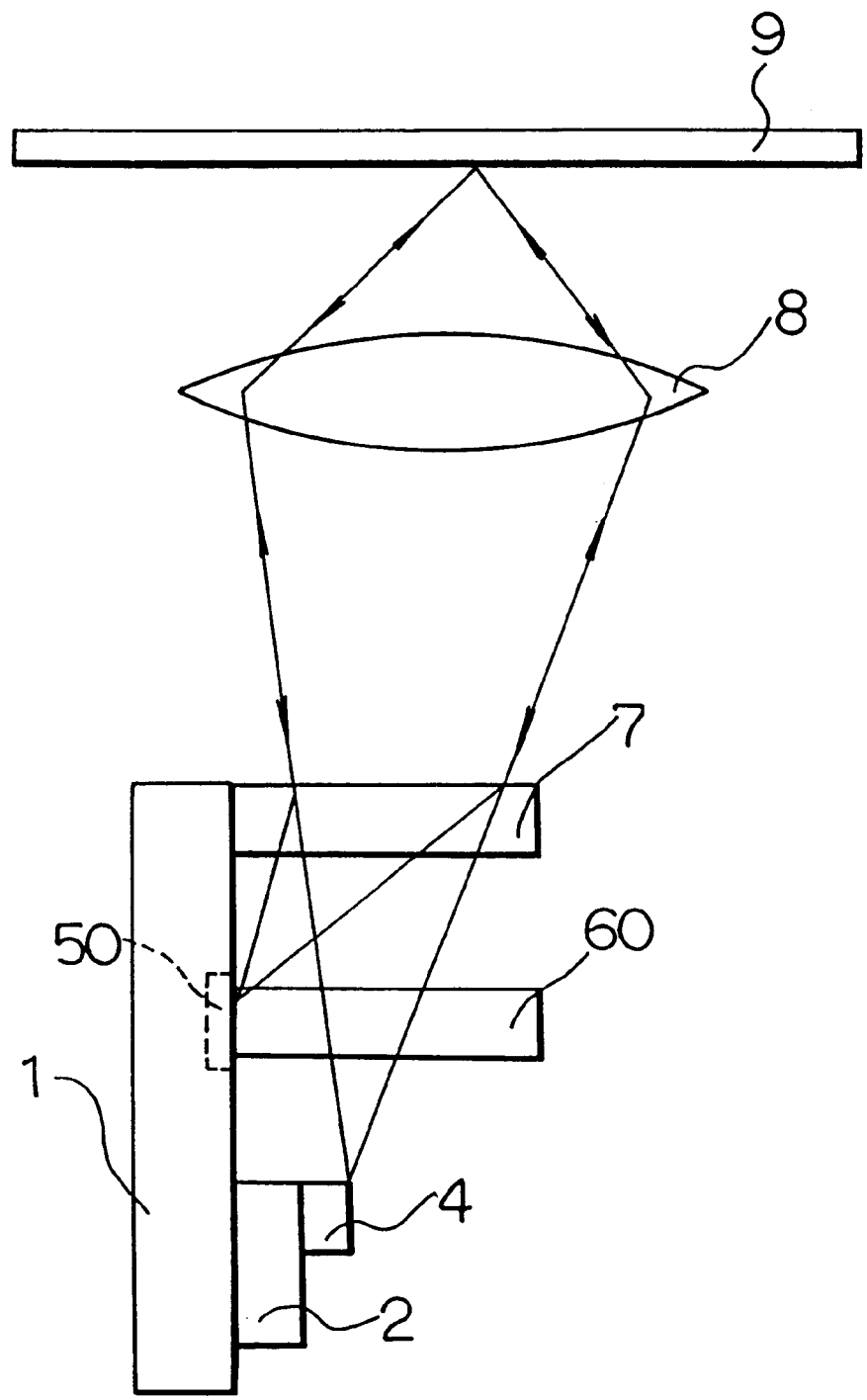
FIG. 16 is a schematic side view showing an arrangement in this embodiment.

An optical pickup device of a fifth preferred embodiment according to the present invention will now be described with reference to the drawings. FIG. 15 is a perspective view showing an arrangement of the optical pickup device where tracking servo by means of the there-beam method and focusing servo by means of the astigmatism method are available, and FIG. 16 is a schematic side view showing the arrangement of the optical pickup device. Like reference numerals denote like and corresponding components to those in the first preferred embodiment, and explanation about the components is omitted for simplification of the discussion.

On an upper surface of a substrate 1 of n$^+$ silicon (Si) plate or the like, a semiconductor laser 4, a three-dividing transmission-type diffraction grating 60 including a hologram, a transmission-type hologram 7 and a photodetector 50 for signal detection are arranged in position.

Figure 17:
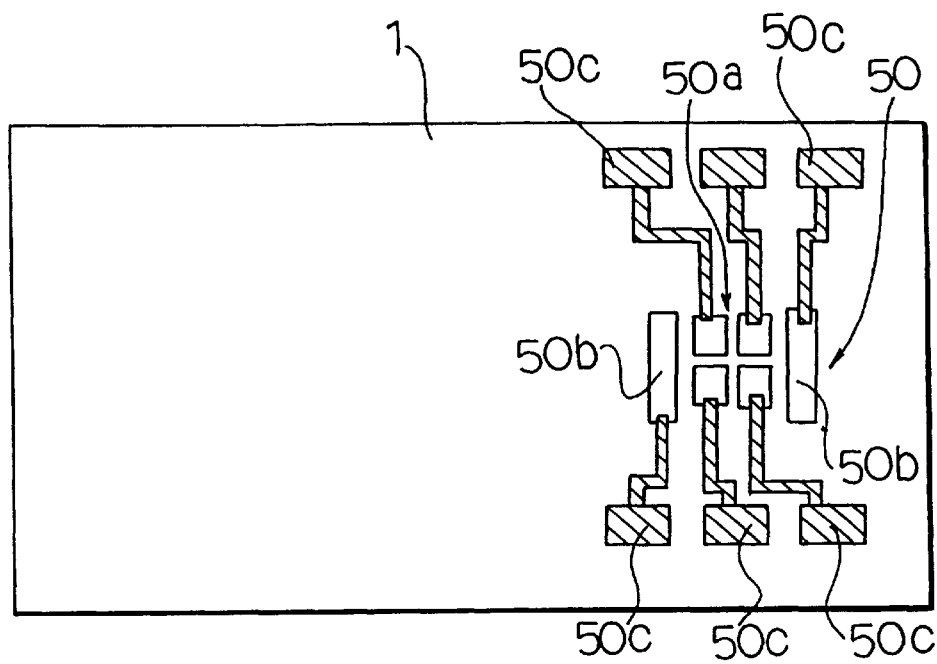
FIG. 17 is a plan view showing a substrate employed in this embodiment.
Figure 18:
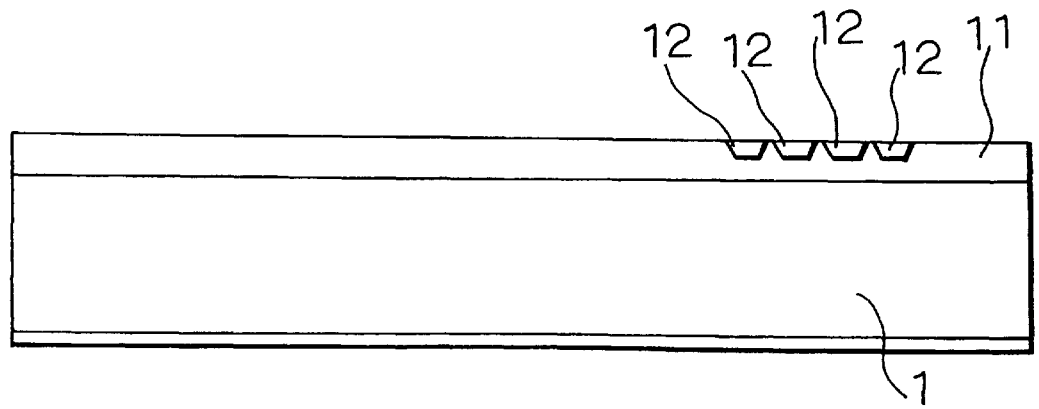
FIG. 18 is a sectional view showing the substrate employed in this embodiment.

On the upper surface of the substrate 1, as shown in FIGS. 17 and 18, the photodetector 50 formed of a divided six-part PIN-type photo diode is provided, and the photo diode consists of an n$^-$ type diffusion layer 11 selectively formed in the surface of the substrate and a p$^+$ type diffusion layer 12 selectively formed in the surface of the n$^-$ diffusion layer 11. A photo detecting surface of the photodetector 50 is in parallel with the upper surface of the substrate 1. As can be seen in the plan view of FIG. 17, since focusing servo by means of the astigmatism method is to be performed in this embodiment, the photodetector 50 is provided with a light detecting unit 50 divided into four section at the center portion and a light detecting unit 50b formed on opposite sides of the light detecting unit 50 for performing tracking servo by means of the three-beam method. In FIG. 17, reference numeral 50c denotes an electrode.

A semiconductor laser 4 is fixed to an n$^+$Si substrate 2 as a semiconductor laser mounting conductive heat sink by means of die bonding and is electrically connected thereto. The semiconductor laser has its first electrode electrically connected to the n$^+$Si substrate 2 and its second electrode positioned in a surface reverse to the surface connected to the n$^+$Si substrate 2. The substrate 2 supporting the semiconductor laser 4 is fixed on the surface with the electrode pattern of the substrate 1, where the photodetector 50 is fixed, in a fixed position relative to the photodetector 50 by Al paste, conductive resin, solder or the like, and the first electrode of the semiconductor laser 4 is electrically connected to the substrate 1. Thus, in this embodiment, both the first and second electrode of the semiconductor laser 4 can be led from the same side of the surface of the substrate 1.

Behind the semiconductor laser 4 on the Si substrate 2, there is provided a photodetector 2a formed of a pin-type photo diode for monitoring power of the laser beam, and the photo diode consists of the n$^-$ type diffusion layer selectively formed in the surface and the p$^+$ type diffusion layer selectively formed in the surface of the n$^-$ diffusion layer.

The semiconductor laser 4 emits a primary laser beam forward for detecting signals in a direction approximately orthogonal to an optical recording medium 9, and it emits a secondary laser beam from its rear facet for monitoring the laser power.

As previously mentioned, since the photodetector 50 for signal detection, the semiconductor laser 4, and the photodetector 2a for monitoring laser beams can have their respective electrodes positioned on the same surface of the substrate 1, wire bonding for wiring these components is facilitated.

In this embodiment, as shown in FIGS. 15 and 16, a three-dividing transmission-type diffraction grating 60 is fixed to the same surface of the substrate by resin or some other substance at a specified distance from the semiconductor the laser 4. The three-dividing transmission-type diffraction grating 60 has gratings at equal intervals, and it splits laser beam emitted forward from the semiconductor laser 4 into zeroth order and ±first order diffracted beams and guides the beams in the forward direction.

A hologram 7 is fixed to the same surface of the substrate 1 by resin or other substance at a specified distance from the three-dividing reflection-type diffraction grating 60. The hologram 7 is a transmission-type hologram, and in this embodiment, it includes an assembly of curves or gratings which are formed on an upper surface of a translucent substrate with pitches gradually varying. The hologram 7 transmits (diffracts in zeroth order) the main-beam and sub-beams to guide them to the optical recording medium. The hologram 7 diffracts in first order the main-beam and sub-beams reflected back from the optical recording medium 9 to vary their optical axes, and it astigmatically converges the beams so that focal lengths vary from a first direction orthogonal to the direction of the beam to a second direction orthogonal to the first direction in the same plane, so as to focus the beams on the photodetector 50 on the substrate 1.

In such an arrangement, the hologram 7 focuses the beams reflected from the optical recording medium 9 on the photodetector 50 within the same substrate 1. In this arrangement, however, although it is impossible to direct light in a direction orthogonal to the photodetector 50, tracking servo according to shapes of beams can be performed, allowing for shapes of spots of beams focused on photo diodes depending upon incident angles of reflected light.

As mentioned above, the present invention provides a highly reliable optical pickup because the components are fabricated on the same substrate and because tracking servo by means of a three-beam method is adopted. Furthermore, the present invention provides a cost-reduced optical pickup because fabrication of the components is facilitated.

Figure 19:
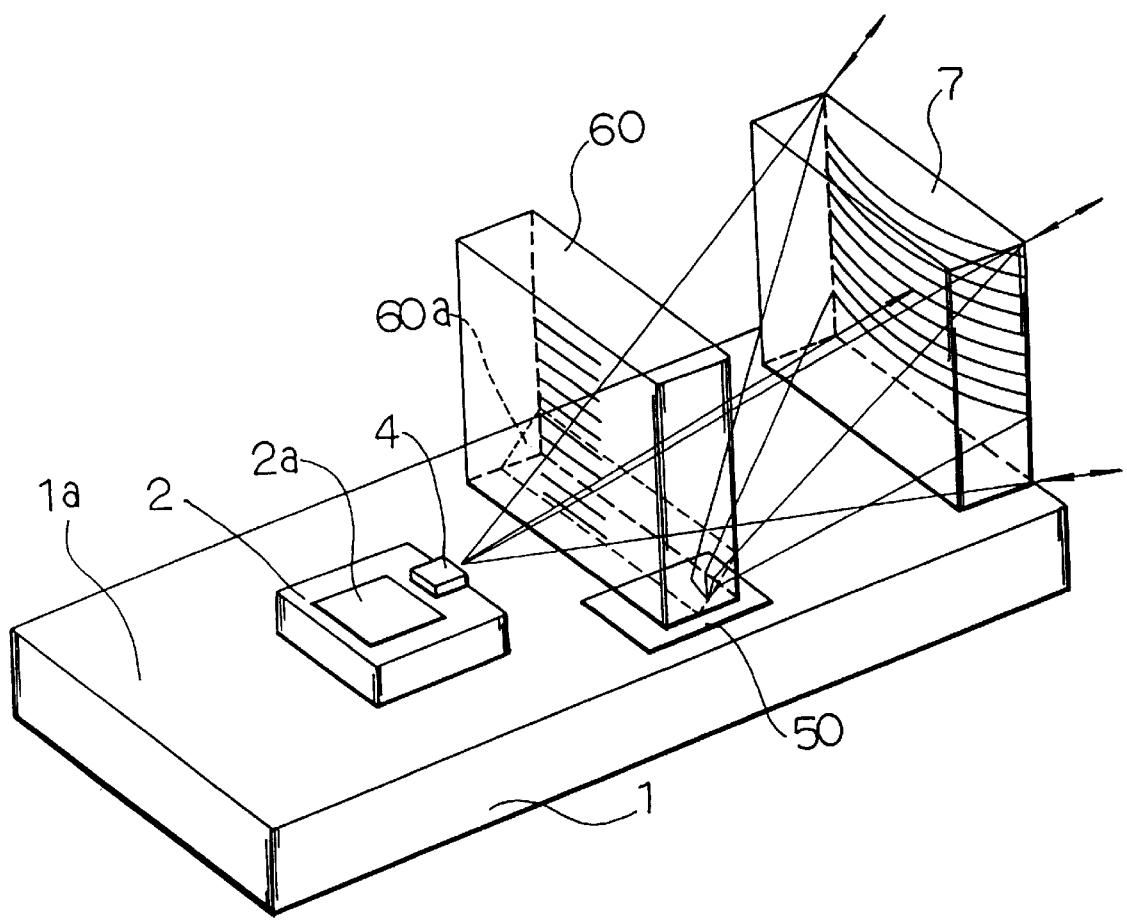
FIG. 19 is a perspective view showing a major portion of an optical pickup device in a sixth preferred embodiment according to the present invention.
Figure 20:
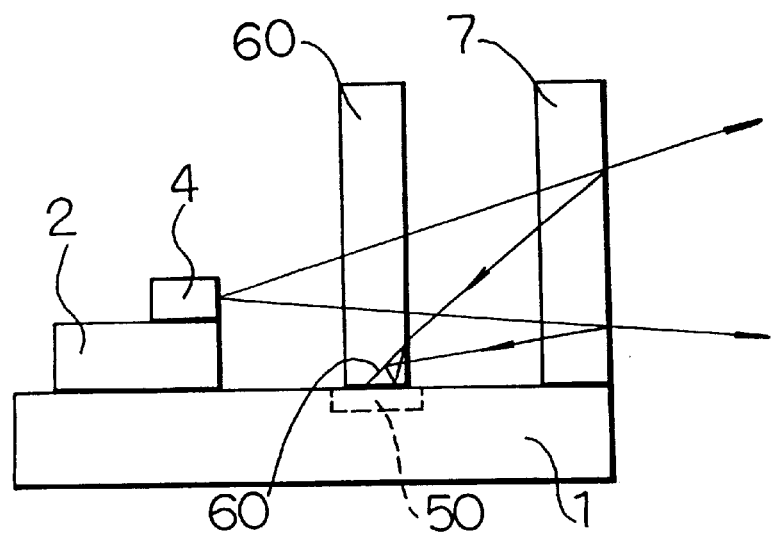
FIG. 20 is a side view showing the major portion of the optical pickup device in this embodiment.

An optical pickup device of a sixth preferred embodiment according to the present invention will now be described with reference to the drawings. FIG. 19 is a perspective view showing an arrangement of the optical pickup device where tracking servo by means of the three-beam method and focusing servo by means of the astigmatism method are available, and FIG. 20 is a schematic side view showing the arrangement of the optical pickup device. Like reference numerals denote like and corresponding components to those in the fifth preferred embodiment, and explanation about them is omitted for simplification of the following discussion.

In the fifth preferred embodiment, the photodetector 50 cannot receive light incident thereon in the direction orthogonal to it. Thus, in the sixth preferred embodiment, it is devised that incident light beams are orthogonal to the photodetector 50. As shown in FIG. 19 and FIG. 20, a transmission-type diffraction grating 60 is provided on the photodetector 50 for signal detection, and the diffraction grating 60 has a reflection mirror 60a which works to direct beams reflected from an optical recording medium to a photo detecting surface of the photodetector 50 in the direction orthogonal to it.

In such an arrangement, the reflection mirror 60a of the diffraction grating 60 guides the beams reflected from an optical recording medium 9 and diffracted by hologram 7 and focuses them on the photodetector 50 so as to be orthogonal to the surface of the photodetector 50. Thus, the prior art tracking servo system is applicable without change, without allowing for special shapes of the beams.

As mentioned above, the present invention provides a highly reliable optical pickup because the components are fabricated on the same substrate and because tracking servo by means of a three-beam method is adopted. Furthermore, the present invention provides a cost-reduced optical pickup because fabrication of the components is facilitated.

Figure 21:
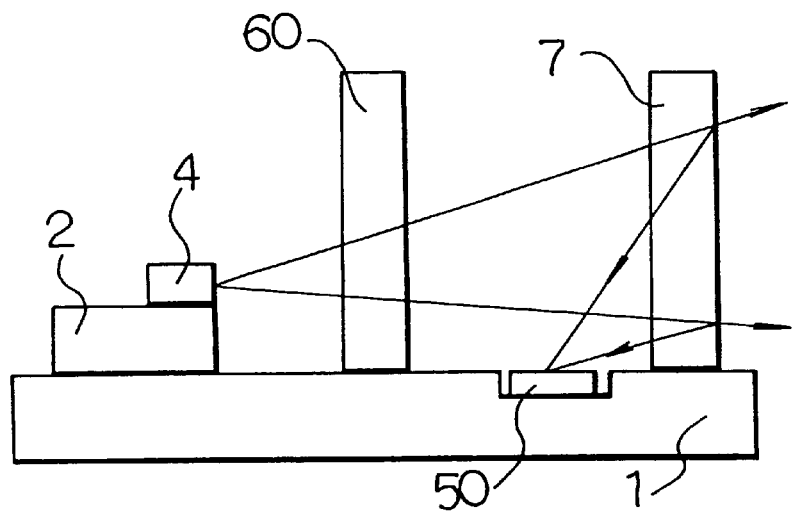
FIG. 21 is a side view showing a major portion of an optical pickup device in a seventh preferred embodiment according to the present invention.

An optical pickup device of a seventh preferred embodiment according to the present invention will now be described with reference to the drawings. FIG. 21 is a schematic side view showing the optical pickup device where tracking servo by means of the three-beam method and focusing servo by means of the astigmatism method are available. Like reference numerals denote like and corresponding components to those in the fifth preferred embodiment, and explanation about them is omitted for simplification of the following discussion.

In this embodiment, a photodetector 50 for signal detection is formed separated from a substrate 1. Materials for the substrate 1 include conductive metal such as copper and the like, and ceramic, resin and the like with an electrode pattern. The photodetector 50 is fixed to the substrate 1, and thereafter, a semiconductor laser 4, a transmission-type diffraction grating 60 and a hologram 7 are fixed in position.

As mentioned above, the pre sent invention provides a highly reliable optical pickup because the components are fabricated on the same substrate and because tracking servo by means of a three-beam method is adopted. Furthermore, the present invention provides a cost-reduced optical pickup because fabrication of the components is facilitated.

Figure 22:
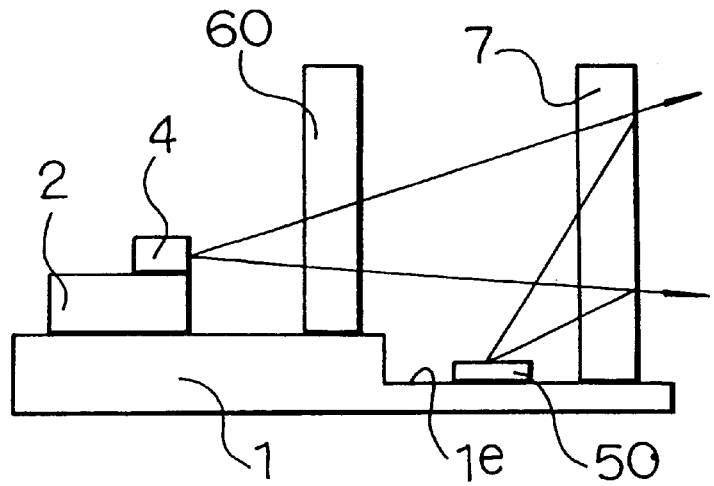
FIG. 22 is a side view showing a major portion of an optical pickup device in an eighth preferred embodiment according to the present invention.

An optical pickup device of an eighth preferred embodiment according to the present invention will now be described with reference to the drawings. FIG. 22 is a schematic side view showing an arrangement of the optical pickup device where tracking servo by means of the three-beam method and focusing servo by means of the astigmatism method are available. Like reference numerals denote like and corresponding parts to those in the fifth preferred embodiment, and explanation about them is omitted for simplification of the following discussion.

In this embodiment, a step 1e is provided in a substrate 1, and a semiconductor laser 4 and a transmission-type diffraction grating 60 are mounted on an upper level while a photodetector 50 for signal detection and a hologram 7 are mounted on a lower level.

In such an arrangement, incident angle of beams reflected from an optical recording medium 9 becomes more close to a right angle upon the photodetector 50, and control of the device is facilitated. Furthermore, since no beam from the semiconductor laser 4 enters the photodetector 50, the S/N ratio of the detected signal is enhanced.

As mentioned above, the present invention provides a highly reliable optical pickup because the components are fabricated on the same substrate and because tracking servo by means of a three-beam method is adopted. Furthermore, the present invention provides a cost-reduced optical pickup because fabrication of the components is facilitated.

Figure 23:
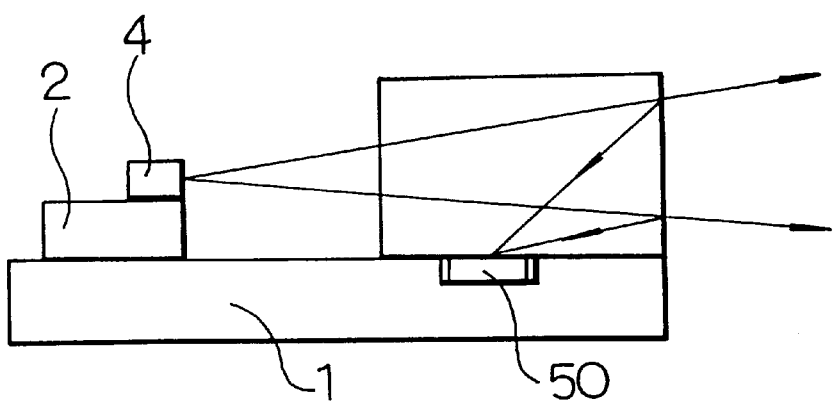
FIG. 23 is a side view showing a major portion of an optical pickup device in a ninth preferred embodiment according to the present invention.

An optical pickup device of a ninth preferred embodiment according to the present invention will be described with reference to the drawings. FIG. 23 is a schematic side view showing the optical pickup device where tracking servo by means of the three-beam method and focusing servo by means of the astigmatism method are available. Like reference numerals denote like and corresponding parts to those in the fifth preferred embodiment, and explanation about them is omitted for simplification of the following discussion.

In this embodiment, a glass block 70 is fixed on a substrate 1 over a photodetector 50 by resin or some other substance at a specified distance from a semiconductor laser 4. A three-dividing diffraction grating and a hologram are formed in a surface of the glass block 70 oriented to the semiconductor laser 4.

As mentioned above, the present invention provides a highly reliable optical pickup because the components are fabricated on the same substrate and because tracking servo by means of a three-beam method is adopted. Furthermore, the present invention provides a cost-reduced optical pickup because fabrication of the components is facilitated.

In assembling the above components, as previously mentioned, the semiconductor laser 4 is fixed in a specified position relative to the photodetector 50 on the substrate 1 while the three-dividing diffraction grating 60 is fixed in position a certain distance away from the semiconductor laser 4. Finally, the hologram 7 is fixed in a specified position relative to the semiconductor laser 4 and three-dividing diffraction grating 60, which is determined in accordance with a design pattern of the hologram. The assembling may depend upon mechanical accuracy, and it may be accurately performed if the hologram 7 is fixed while the semiconductor laser 4 is being controlled to emit a controlled laser beam and intensity of a signal for the photodetector 50 detecting.

Figure 24:
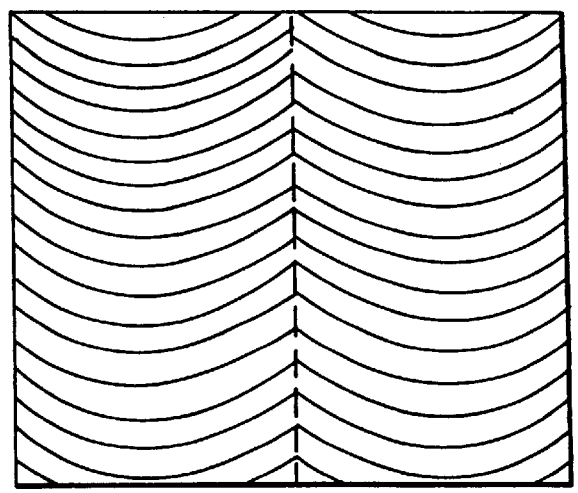
FIG. 24 is a plan view showing a transmission-type hologram used in a spot size method.
Figure 25:
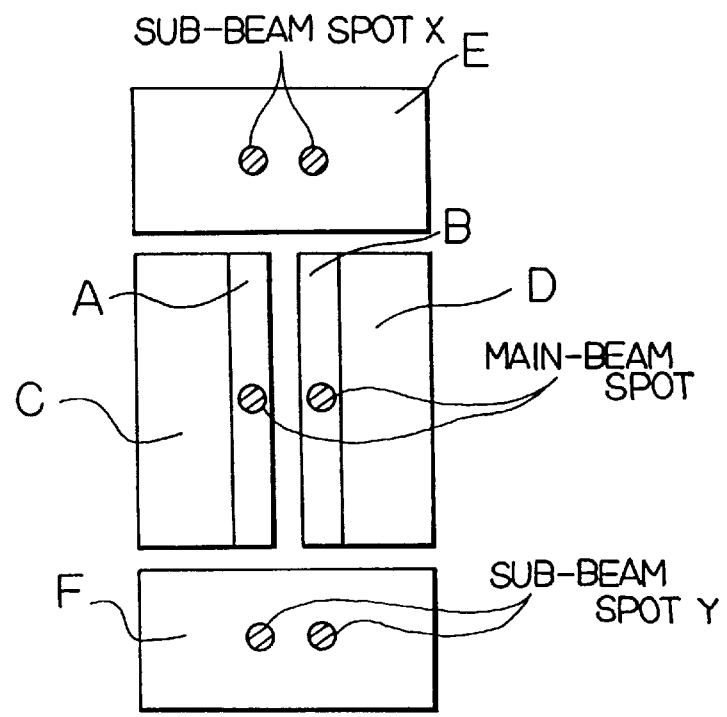
FIG. 25 is a plan view showing a transmission-type hologram used in Foucault method.

Although, in the above-mentioned embodiment, focusing servo is astigmatically performed, other methods may be employed; for example, the hologram 7 may be replaced with a transmission-type hologram having a grating configuration as shown in FIG. 24, and the photodetectors 5 and 35 may be replaced with a light detecting element as shown in FIG. 25 to perform focusing servo by means of a spot size detection method. In such a case, the main-beam and sub-beams X and Y are respectively divided in two and diffracted in first order by the hologram, and the resultant two main-beams are directed to light detecting units A and C, and light detecting units B and C while the two sub-beams X and Y are directed to light detecting units E and F, to form spots thereon. Thus, an FE signal, a TE signal and a reproducing signal are expressed as follows:

FE signal=$(A1-C1)-(B1-D1)$

TE signal=$E1-F1$

Reproducing signal=$A1+B1+C1+D1$ where A1 to F1 in the above equations are intensities of detected light in the light detecting units A to F shown in FIG. 25.

Figure 26:
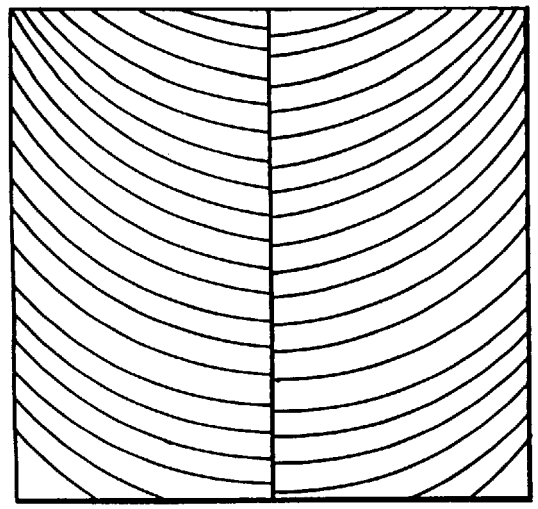
FIG. 26 is a plan view of a hologram with a grating configuration.
Figure 27:
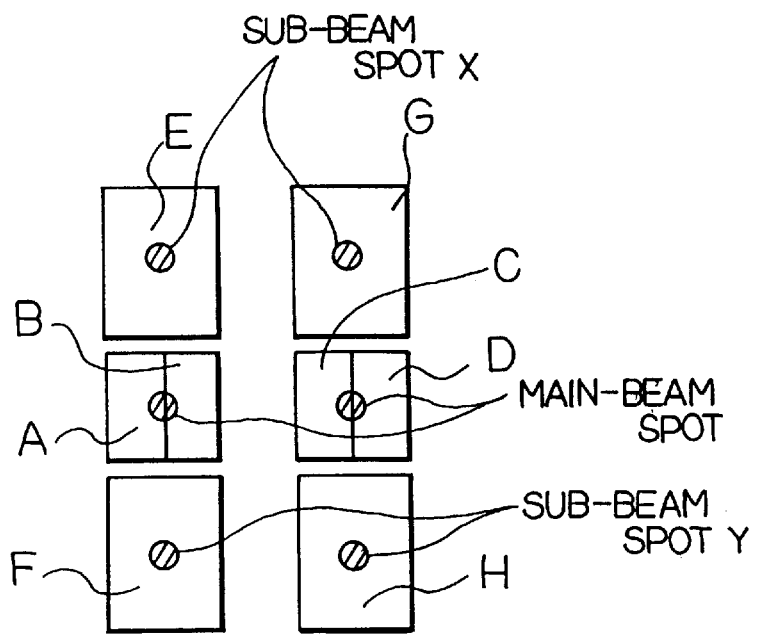
FIG. 27 is a plan view showing a light detecting element used in Foucault method.
Figure 28:
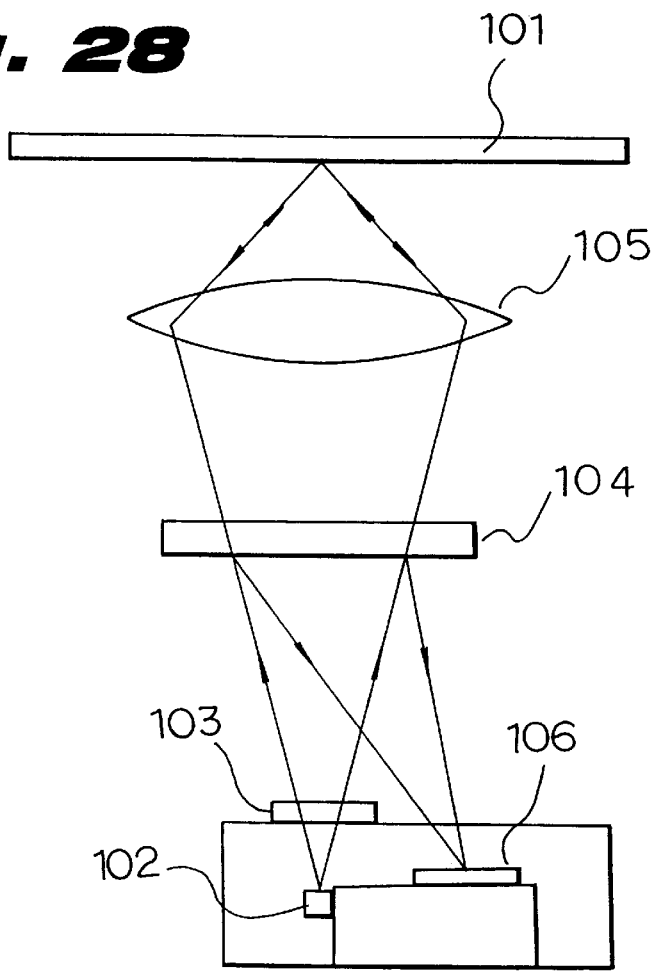
FIG. 28 is a schematic diagram showing an arrangement of an optical pickup device in the prior art embodiment.

Besides the above examples, the hologram 7 may be replaced with a hologram having a grating configuration shown in FIG. 26, and the photodetectors 5 and 35 may be replaced with a light detecting element shown in FIG. 27 to perform focusing servo by the Foucault method. In such a case, the main-beam and sub-beams X and Y are respectively divided into two and directed to the light detecting units A to H to form spots. Thus, the FE signal, TE signal and reproducing signal are expressed as follows:

FE signal=$(A1+D1)-(B1+C1)$

TE signal=$(E1+G1)-(F1+H1)$

Reproducing signal=$A1+B1+C1+D1$ where A1 to H1 in the above equations are intensities of detected light in the light detecting units A to H shown in FIG. 27.

Although the present invention has been described and illustrated in detail, it is clearly understood that the same is by way of illustration and example only and is not to be taken by way of limitation, the spirit and scope of the present invention being limited only by the terms of appended claim.

What is claimed is:

1. An optical pickup device for a reflective type optical recording medium, comprising:
    a single piece flat board type substrate having an upper surface;
    a semiconductor laser mounted on said substrate upper surface for emitting a laser beam in a first direction substantially parallel to said substrate upper surface;
    a transmission-type diffraction grating on said substrate upper surface disposed substantially perpendicular to said substrate upper surface for receiving the laser beam from said laser, splitting the laser beam passing through said grating into at least three beams and guiding them substantially in said first direction forwardly of said diffraction grating;
    a hologram mounted on said substrate substantially perpendicular to said substrate upper surface for receiving the at least three beams transmitted through said diffraction grating and guiding them substantially in said first direction forwardly of said hologram so as to be incident on an optical recording medium and reflected from said optical recording medium;
    a photodetector for signal detection with a photodetecting surface parallel with said substrate upper surface for receiving the at least three beams reflected from the optical recording medium, and redirected by said hologram onto said photodetecting surface; and
    a plurality of electrodes formed directly on the upper surface of said substrate, each of said electrodes connected to said photodetector.

2. A device according to claim 1, wherein said substrate upper surface has a recessed section, said photodetector being positioned in said recessed section.

3. A device as in claim 1 wherein said transmission type diffraction grating and said hologram are supported by said substrate.

4. A device as in claim 1 wherein said hologram and said transmission type diffraction grating are an integral unit mounted on said substrate.

5. A device as in claim 4, wherein said photodetector is mounted below said hologram and said transmission-type diffraction grating integral unit.

6. A device as in claim 1, wherein the lower surface of each of said hologram and said transmission-type diffraction grating are mounted to said upper surface of said substrate.

7. A device according to claim 1 further comprising a second electrode formed on said substrate upper surface to which said semiconductor laser is connected.

8. A device as in claim 1 wherein said photodetector comprises a diffusion layer formed on said upper surface.

9. A device as in claim 1, wherein said photodetector is disposed on said substrate.

10. A device as in claim further comprising an optical system for converging the beams transmitted from said hologram onto the optical recording medium.

11. A device as in claim 1 wherein said photodetecting surface is located at a position which is one of under said transmission type diffraction grating and between said diffraction grating and said hologram.

12. A device as in claim 1 further comprising a reflection mirror for guiding the beams received after reflection from the recording medium and from said hologram to said photodetector.

13. A device as in claim 12 wherein said reflection mirror is provided on said transmission-type diffraction grating.

14. An optical pickup device for a reflective type optical recording medium as in claim 12 wherein said mirror does not reflect the beam emitted from said semiconductor laser and directed to said recording medium.

15. A device according to claim 1, wherein the substrate is a semiconductor substrate.

16. A device according to claim 15, wherein said photodetector comprises a diffusion layer formed on said upper surface.

* * * * *

UNITED STATES PATENT AND TRADEMARK OFFICE
CERTIFICATE OF CORRECTION

PATENT NO. : 6,072,607
DATED : June 6, 2000
INVENTOR(S) : Atsushi Tajiri et al.

It is certified that errors appear in the above-identified patent and that said Letters Patent is hereby corrected as shown below:

Title page, [73] Assignee: please change "Sanyo Electric Co., Ltd., Moriguchi, Japan" to -- Sanyo Electric Co., Ltd, Osaka-fu, Japan --.

Signed and Sealed this

Twenty-second Day of May, 2001

Attest:

NICHOLAS P. GODICI

*Attesting Officer*  *Acting Director of the United States Patent and Trademark Office*